US008964489B2

(12) United States Patent
Saito

(10) Patent No.: US 8,964,489 B2
(45) Date of Patent: Feb. 24, 2015

(54) SEMICONDUCTOR MEMORY DEVICE CAPABLE OF OPTIMIZING AN OPERATION TIME OF A BOOSTING CIRCUIT DURING A WRITING PERIOD

(75) Inventor: Toshihiko Saito, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 461 days.

(21) Appl. No.: 12/759,725

(22) Filed: Apr. 14, 2010

(65) Prior Publication Data
US 2010/0265754 A1 Oct. 21, 2010

(30) Foreign Application Priority Data

Apr. 17, 2009 (JP) ................. 2009-100811

(51) Int. Cl.
G11C 7/22 (2006.01)
G11C 5/14 (2006.01)
G11C 17/18 (2006.01)
H01L 27/10 (2006.01)
H01L 23/525 (2006.01)

(52) U.S. Cl.
CPC ............. G11C 5/145 (2013.01); G11C 17/18 (2013.01); H01L 27/101 (2013.01); H01L 23/5252 (2013.01)
USPC ........... 365/189.16; 365/189.09; 365/189.07; 365/225.7; 365/148; 365/163; 365/228; 365/195; 327/537; 327/535

(58) Field of Classification Search
USPC ................. 365/96, 100, 104, 103, 148, 163, 365/189.16, 189.09, 189.07, 225.7, 227, 365/229, 228, 226, 195, 191; 327/536, 537, 327/535, 534
See application file for complete search history.

(56) References Cited

U.S. PATENT DOCUMENTS

| 5,153,855 A | 10/1992 | Konishi |
| 5,418,751 A * | 5/1995 | Kaiser ........................... 365/211 |
| 5,422,842 A * | 6/1995 | Cernea et al. ............ 365/185.22 |
| 5,684,741 A | 11/1997 | Talreja |
| 6,051,851 A | 4/2000 | Ohmi et al. |
| 6,081,448 A * | 6/2000 | Pasotti et al. ............ 365/185.03 |
| 6,097,639 A * | 8/2000 | Choi et al. ............... 365/185.28 |
| 6,233,201 B1 * | 5/2001 | Sone ............................. 365/241 |
| 6,434,060 B1 | 8/2002 | Tran et al. |
| 6,798,274 B2 | 9/2004 | Tanimoto |
| 6,940,744 B2 * | 9/2005 | Rinerson et al. .............. 365/148 |
| 7,362,297 B2 | 4/2008 | Koyama |
| 7,388,770 B2 | 6/2008 | Namekawa et al. |

(Continued)

FOREIGN PATENT DOCUMENTS

EP 0408368 A 1/1991
EP 0 680 087 A2 11/1995

(Continued)

Primary Examiner — Andrew Q Tran
(74) Attorney, Agent, or Firm — Nixon Peabody LLP; Jeffrey L. Costellia

(57) ABSTRACT

When writing into an antifuse memory element finishes, a value of resistance of the memory element rapidly decreases; accordingly, an output voltage of a boosting circuit which produces a writing voltage rapidly decreases. By detecting a change in the output voltage of the boosting circuit to control a writing command, the writing operation can be stopped immediately after the memory element is shorted. Thus, unnecessary current consumption caused by continuing a writing operation on the shorted memory element can be suppressed.

10 Claims, 23 Drawing Sheets

(56) References Cited

U.S. PATENT DOCUMENTS

| | | | |
|---|---|---|---|
| 7,477,092 B2 * | 1/2009 | Pan | 327/536 |
| 7,741,818 B2 * | 6/2010 | Agari | 323/224 |
| 8,127,998 B2 * | 3/2012 | Kozuma et al. | 235/492 |
| 8,238,158 B2 * | 8/2012 | Shelton et al. | 365/185.03 |
| 2008/0083954 A1 | 4/2008 | Tokunaga | |
| 2008/0093935 A1 | 4/2008 | Saito et al. | |
| 2008/0143425 A1 | 6/2008 | Ito | |
| 2008/0149737 A1 | 6/2008 | Ohshima | |
| 2009/0057418 A1 | 3/2009 | Kozuma et al. | |

FOREIGN PATENT DOCUMENTS

| | | |
|---|---|---|
| EP | 1 282 136 A1 | 2/2003 |
| JP | 02-023653 | 1/1990 |
| JP | 03-046198 A | 2/1991 |
| JP | 07-297293 | 11/1995 |
| JP | 2001-344981 | 12/2001 |
| JP | 2003-088103 | 3/2003 |
| JP | 2003-123496 | 4/2003 |
| JP | 3501416 | 3/2004 |
| JP | 2006-196079 | 7/2006 |
| WO | WO 2008/041716 A1 | 4/2008 |

* cited by examiner

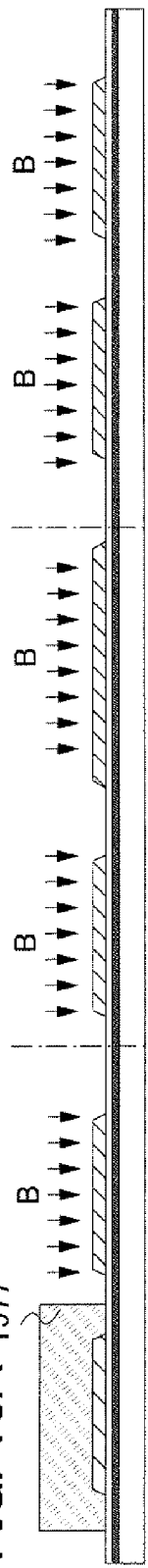
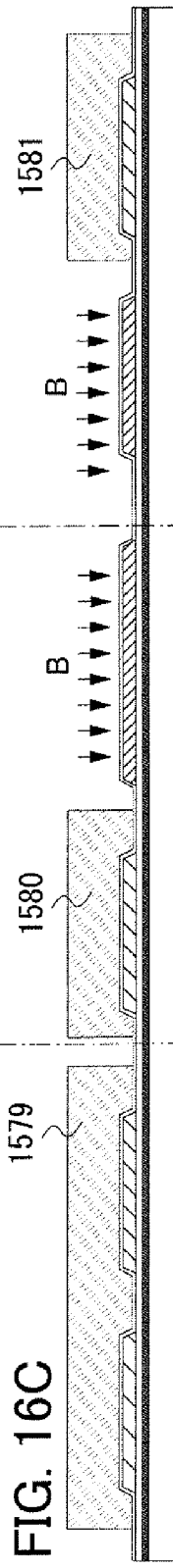
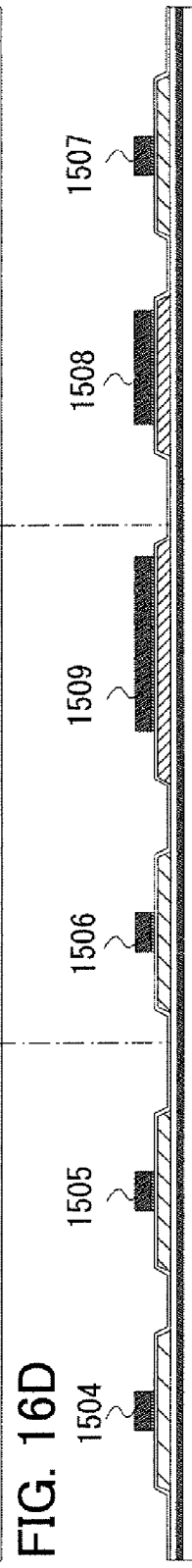
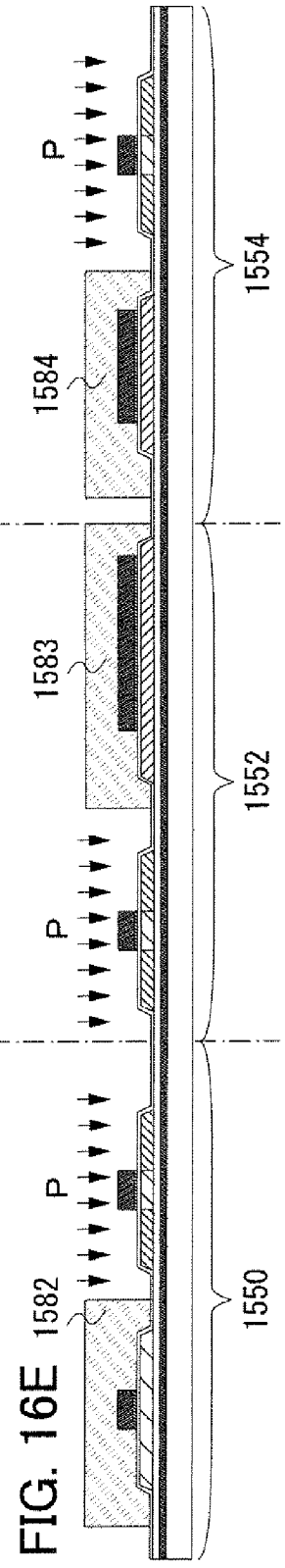
FIG. 16A
FIG. 16B
FIG. 16C
FIG. 16D
FIG. 16E

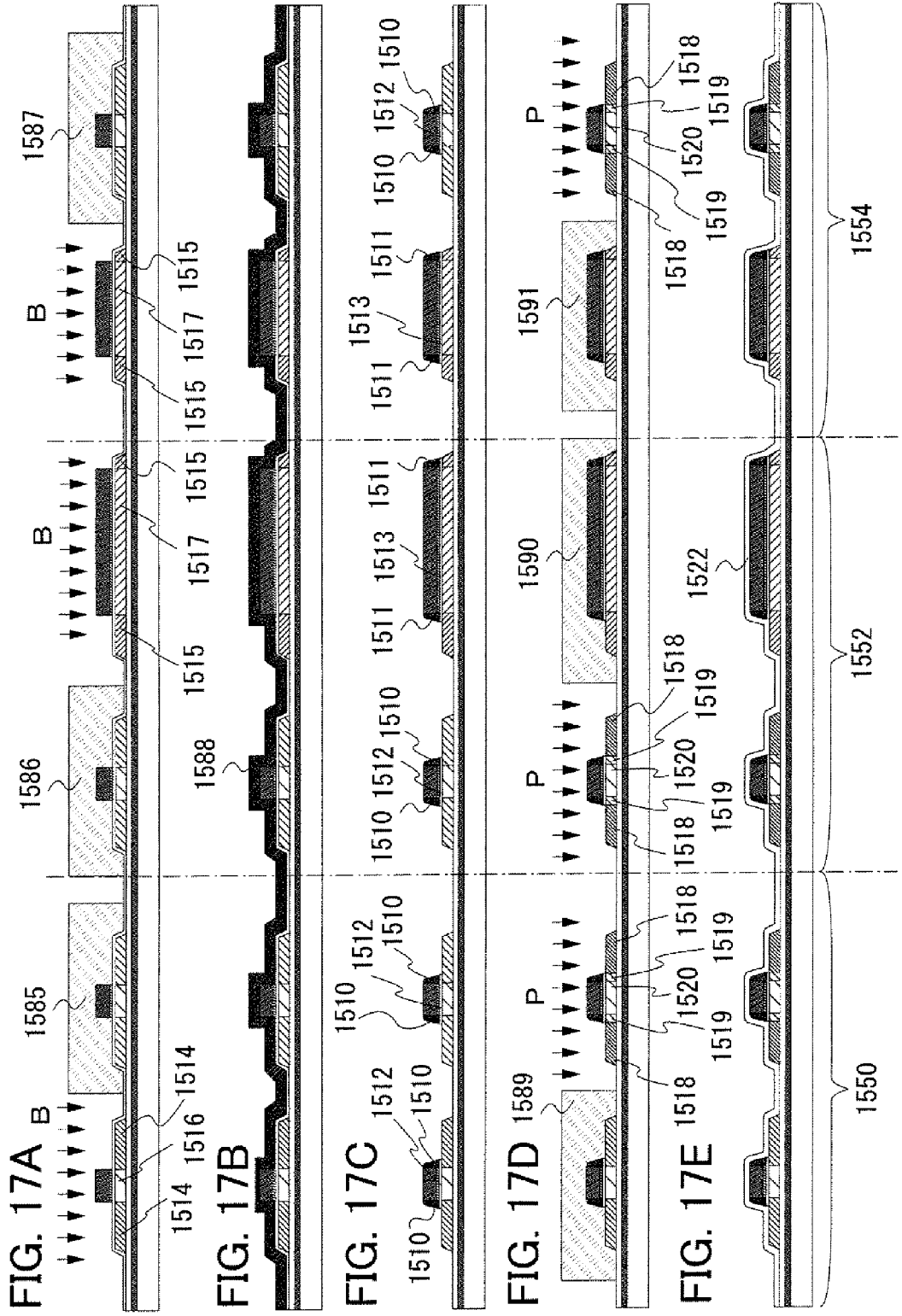

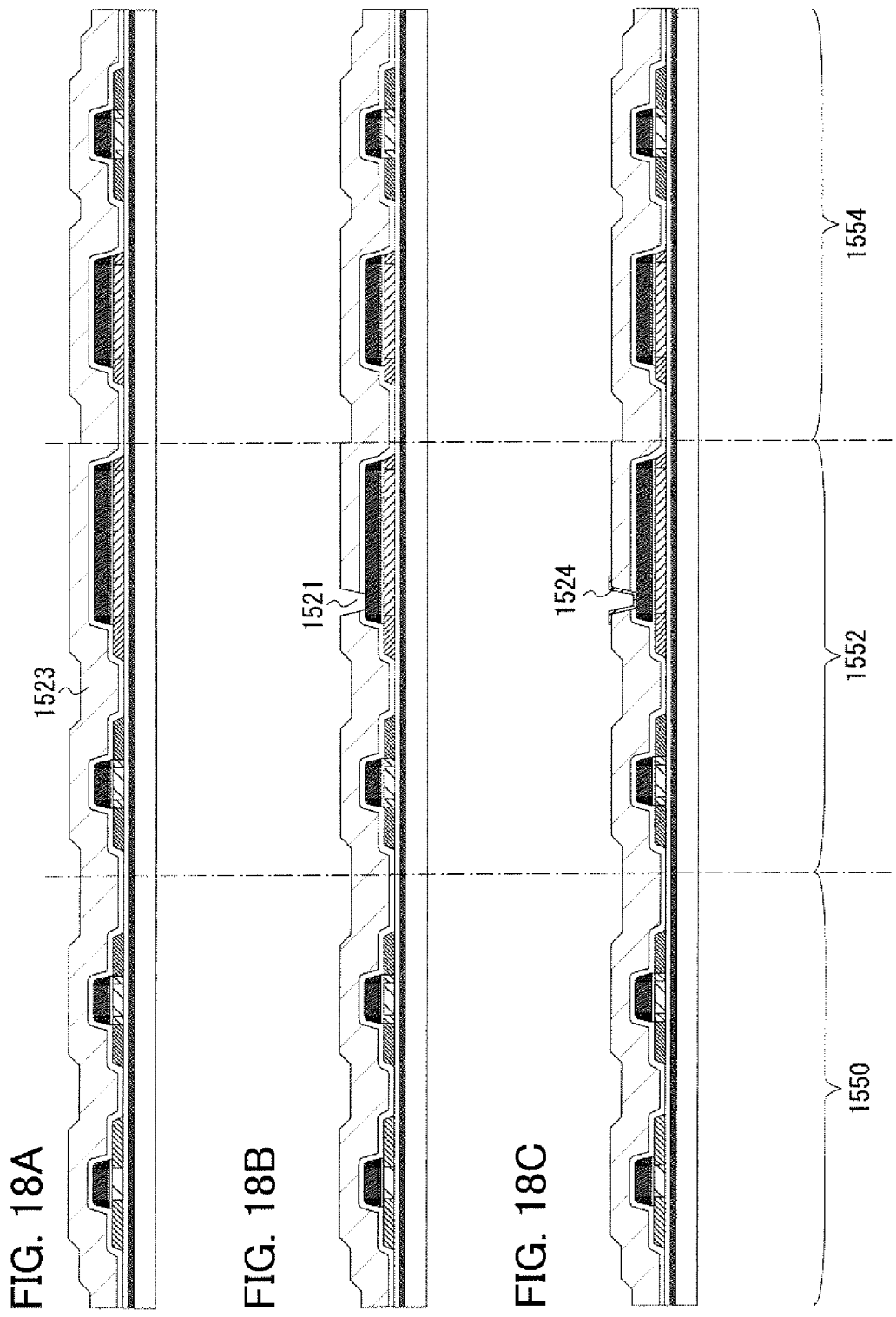

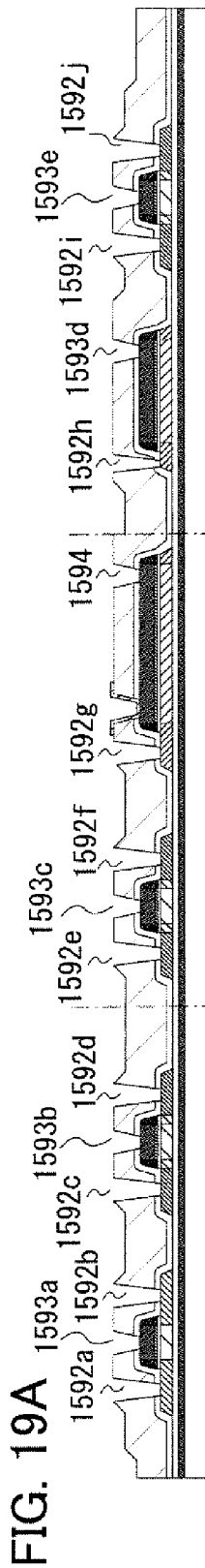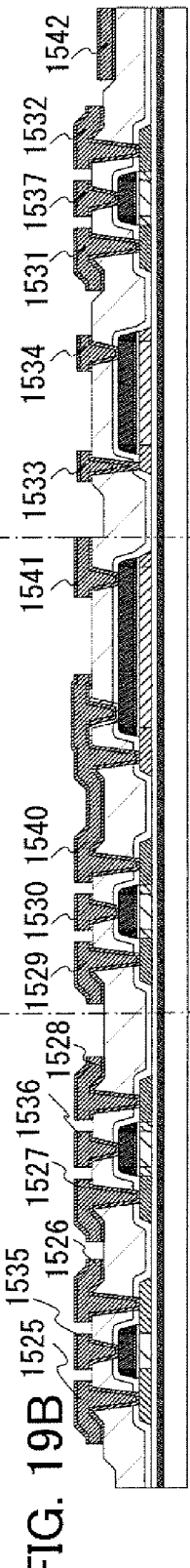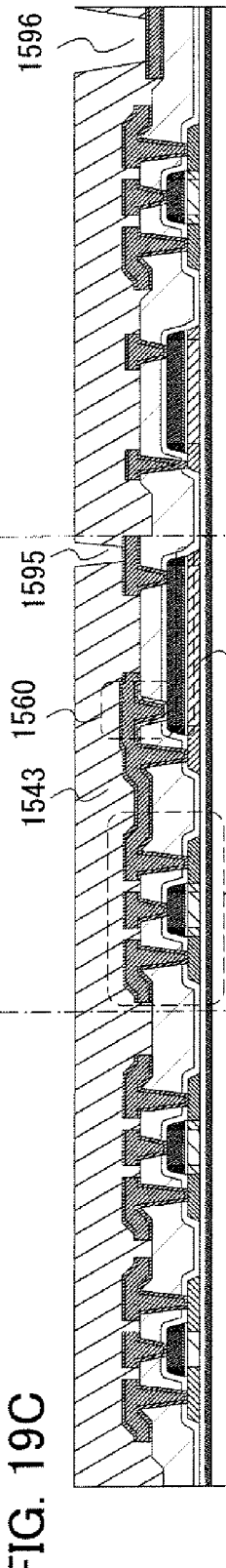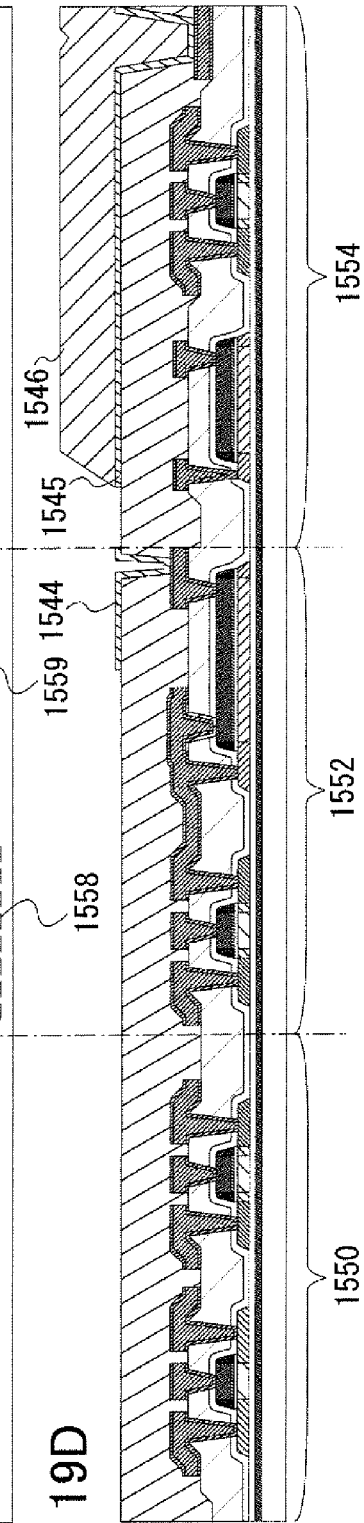

FIG. 23A   PRIOR ART

|  | 0~5us average | 5us | 5~15us average | 15~75us average | 0~75us average |
|---|---|---|---|---|---|
| V(VHH) [V] | − | 9.55 | 4.81 | 4.11 | − |
| V(BIT) [V] | − | 9.54 | 2.31 | 2.03 | − |
| V(MEM) [V] | − | 9.00 | 0.83 | 0.67 | − |
| I(MEM) [uA] | 2.37/3.05 | − | 250/257 | 208/208 | 199/209 |
| I(VIN) [uA] | −2169/3002 | − | −2344/3191 | −2412/3282 | −2387/3252 |

FIG. 23B

|  | 0~5us average | 5us | 5~15us average | 15~75us average | 0~75us average |
|---|---|---|---|---|---|
| V(VHH) [V] | − | 9.44 | 4.07 | 0.92 | − |
| V(BIT) [V] | − | 9.42 | 2.06 | 0.85 | − |
| V(MEM) [V] | − | 8.75 | 0.67 | 0.02 | − |
| I(MEM) [uA] | 2.29/2.81 | − | 201/225 | 7.42/8.89 | 33.0/82.8 |
| I(VIN) [uA] | −2119/2970 | − | −1545/2571 | −2.25/3.50 | −349/1212 |

SEMICONDUCTOR MEMORY DEVICE CAPABLE OF OPTIMIZING AN OPERATION TIME OF A BOOSTING CIRCUIT DURING A WRITING PERIOD

BACKGROUND OF THE INVENTION

1. Field of the Invention

The present invention relates to semiconductor memory devices. Further, the present invention relates to semiconductor devices on which semiconductor memory devices are mounted.

2. Description of the Related Art

Recently, an individual-recognition technology has attracted attention. In the individual-recognition technology, an individual identification number (ID) is given to each individual object so that information such as a history of the object can be identified and used for production, management, and the like. In particular, an individual-recognition technology in which semiconductor devices which are capable of transmitting and receiving data without contact are used has been developed and starts to be introduced into companies, markets, and the like. Such a semiconductor device is referred to as a radio frequency identification (RFID) tag, an RF tag, an ID tag, an integrated circuit (IC) tag, an IC chip, a wireless tag, a wireless chip, or the like.

By mounting a memory device (hereinafter, also referred to as a memory or a memory circuit in this specification) on such a semiconductor device, a semiconductor device with higher function (hereinafter, also referred to as a semiconductor memory device in this specification) can be realized. Among the memory devices mounted on the semiconductor memory devices, a memory having a plurality of memory cells which are writable only once, which is one type of a nonvolatile memory, is preferable from a security standpoint because tampering with the data is not easy. Such a memory is referred to as a one-time programmable memory (hereinafter, also referred to as an OTP memory or simply an OTP in this specification).

As one type of an OTP memory, an antifuse memory (hereinafter, also referred to as a silicide memory in this specification) has been proposed. In an antifuse memory, one of electrodes is formed using metal and an antifuse becomes conductive by a silicide reaction of amorphous silicon with the metal (for example, see Patent Document 1).

In addition, a circuit has been proposed in which a capacitor for supplying electric power in writing (hereinafter, referred to as an assist capacitor in this specification) is provided in parallel with a memory element in a memory cell of an OTP memory (for example, see Patent Document 2). In particular, in a silicide memory, a high writing yield can be achieved by providing an assist capacitor.

PATENT DOCUMENT

[Patent Document 1] Japanese Patent No. 3501416
[Patent Document 2] Japanese Published Patent Application No. 02-023653

SUMMARY OF THE INVENTION

A problem in an antifuse memory is that a period of time needed for transition from an insulating state to a shorted state, that is, a writing time, varies considerably between memory cells. Typically, although writing into most of the memory cells finish in a short time, writing into a small number of memory cells needs a longer time. In a memory, the two types of the memory cells exist.

A problem in writing into memory elements will be described with reference to FIGS. 13A to 13C. FIGS. 13A to 13C illustrate examples of an operation of memory cells.

FIG. 13A shows the case where the same period of time is employed for writing into every memory cell. In FIG. 13A, 1301a to 1301c each denote a period of time for writing into one memory cell. Although the periods 1301a to 1301c have the same length, a period of time needed for transition from an insulating state to a shorted state varies between memory cells. The periods of time needed for transition are denoted by periods 1302a to 1302c, for example. In FIG. 13A, the period 1302b is the longest period needed for transition from an insulating state to a shorted state. Thus, the length of the periods 1301a to 1301c is set based on a period of time which is long enough to certainly finish writing into the memory cell which requires the period 1302b. Periods 1303a to 1303c each denote a period of time from when writing finishes until the next writing starts in the memory cells. For a memory cell into which writing finishes in a short time, such a period is not preferably provided in terms of time efficiency. In addition, the period may cause an adverse effect due to continuous application of current to the memory element into which writing already finishes. As described above, in a silicide memory, the number of memory cells which need a long transition time is small and most of the memory cells are short circuited in a short time; therefore, the period given for writing include an inefficient time for most of the memory elements, in this method.

In FIG. 13B, a method is shown in which, in order to eliminate the inefficient time described above, a period of a writing operation is divided into unit time, and after a writing operation of each unit time, a reading operation is performed to see if the writing finishes. The operation is repeated until writing into the memory cell finishes. A writing operation per unit time includes a pair of a writing operation 1310a and a reading operation 1310b as shown as a period 1310. In FIG. 13B, data is written into seven memory cells in as denoted by periods 1311a to 1311g. In the period 1311a, writing into a memory cell finishes by repetition of a writing operation and a reading operation in unit time for three times. Writing finishes in the shortest period in the memory cells into which writing is performed in the periods 1311b and 1311g. In each of the memory cells, writing finishes with a writing operation and a reading operation in one unit time. In contrast, the memory cell into which writing is performed during the period 1311e takes the longest time. A writing operation and a reading operation in unit time are repeated for four times before the writing finishes in that memory cell.

The method in FIG. 13B has an advantage over the method in FIG. 13A in that a writing time can be effectively set for a plurality of memory cells which need different periods of time for writing. However, in the method in FIG. 13B, a reading operation after every writing operation in each unit time is time-consuming. In addition, since reading operations are performed before and after a writing operation, in transition from one reading operation to the following writing operation, a reset operation of a boosting circuit is needed in the beginning of every writing operation in unit time, as illustrated as a reset operation 1320 in the writing operation 1310a in an example shown in FIG. 13C. Therefore, a period of time in which a writing voltage can be normally applied to the memory element is actually limited to a period 1330. In other words, this reset operation of the boosting circuit is time-consuming.

Moreover, if a period of time from when a memory element is shorted to finish writing until a writing operation finishes is long, since current of high potential for writing flows through the shorted memory element to a ground potential during that period, current consumption may be increased. Note that a memory element which is once shorted has a low resistance value; therefore, the amount of current in that period is not negligible.

In view of the foregoing, it is an object to provide a semiconductor memory device in which a writing operation can be performed in an optimum writing time without an inefficient period and in which an increase in current consumption can be suppressed.

Resistance of an antifuse memory element rapidly decreases when writing finishes, that is, when the memory element changes to a shorted state; thus, an output voltage of a boosting circuit rapidly drops. Accordingly, if the output voltage of the boosting circuit is monitored, timing of when writing finishes can be detected. Therefore, a circuit which monitors the output voltage of the boosting circuit is provided to detect the timing of when writing finishes, and a writing command to a memory is controlled.

By providing such a circuit, whether a memory element is shorted or not can be determined during writing into the memory element; therefore, a reading operation on the memory element for determining whether data is written into the memory element or not becomes unnecessary. Accordingly, a period of time needed for reading can be reduced (e.g., time for reading, or time for boosting a voltage for resuming a writing operation can be reduced). In addition, it is possible to stop a writing operation at the moment the memory element is shorted and a writing voltage decreases; therefore, there is no time-lag between shortening of the memory element and the end of the writing operation. Accordingly, a period of time from when the memory element is shorted until a writing operation finishes can be prevented from inefficiently consumed.

Further, by monitoring the output voltage of the boosting circuit to detect a change in the output voltage and to control a writing command, a writing operation can be stopped immediately after the memory element is shorted. Thus, unnecessary current consumption which is caused by continuing a writing operation on a shorted memory element can be suppressed.

A semiconductor memory device according to one embodiment of the present invention includes a memory element including a first electrode, a second electrode, and a semiconductor layer between the first electrode and the second electrode; a boosting circuit generating a writing voltage for the memory element; and a monitor circuit which monitors an output of the boosting circuit. In the semiconductor memory device, the monitor circuit detects a change in the output of the boosting circuit in a writing operation on the memory element and outputs a signal to stop the writing operation on the memory element.

A semiconductor memory device according to one embodiment of the present invention includes a memory element including a first electrode, a second electrode, and a semiconductor layer between the first electrode and the second electrode; a boosting circuit generating a writing voltage for the memory element; and a monitor circuit which monitors an output of the boosting circuit. In the semiconductor memory device, the monitor circuit detects a change in the output of the boosting circuit in a writing operation on the memory element and outputs a signal to stop a boosting operation of the boosting circuit.

According to one embodiment of the present invention, by the signal for stopping the boosting operation of the boosting circuit, supply of a clock signal to the boosting circuit is stopped.

According to one embodiment of the present invention, the memory element stores data when the writing voltage is applied between the first electrode and the second electrode to change a value of resistance between the first electrode and the second electrode.

According to one embodiment of the present invention, a non-contact data processing device which includes the above-described semiconductor memory device, a wireless communication circuit and an arithmetic process circuit can be provided. In the non-contact data processing device, data is written to the semiconductor memory device and data is read from the semiconductor memory device via wireless communication.

By the above-described semiconductor memory device, an operation time of the boosting circuit can be optimized. Thus, unnecessary current consumption which is caused by an operation of the boosting circuit after the memory element is shorted can be suppressed. In addition, at the same time as the boosting circuit stops an operation, a writing operation finishes, whereby a writing time can be optimized. In addition to those effects, the following can be achieved. An adverse effect on the shorted memory element can be prevented by minimizing application of current of high potential after the memory element is shorted. Further, since a reading operation for determining whether data is property written into the memory element or not in writing becomes unnecessary, logic of the writing operation on the memory element can be simplified, whereby current consumption can be reduced and a circuit area can be smaller.

BRIEF DESCRIPTION OF THE DRAWINGS

FIGS. 16A to 16E show one example of a manufacturing process of a semiconductor device.

FIGS. 17A to 17E show one example of a manufacturing process of a semiconductor device.

FIGS. 18A to 18C show one example of a manufacturing process of a semiconductor device.

FIGS. 19A to 19D show one example of a manufacturing process of a semiconductor device.

FIGS. 23A and 23B are tables for a comparison of voltage and current between circuit simulation models of a conventional example and of Example.

DETAILED DESCRIPTION OF THE INVENTION

Figure 1:
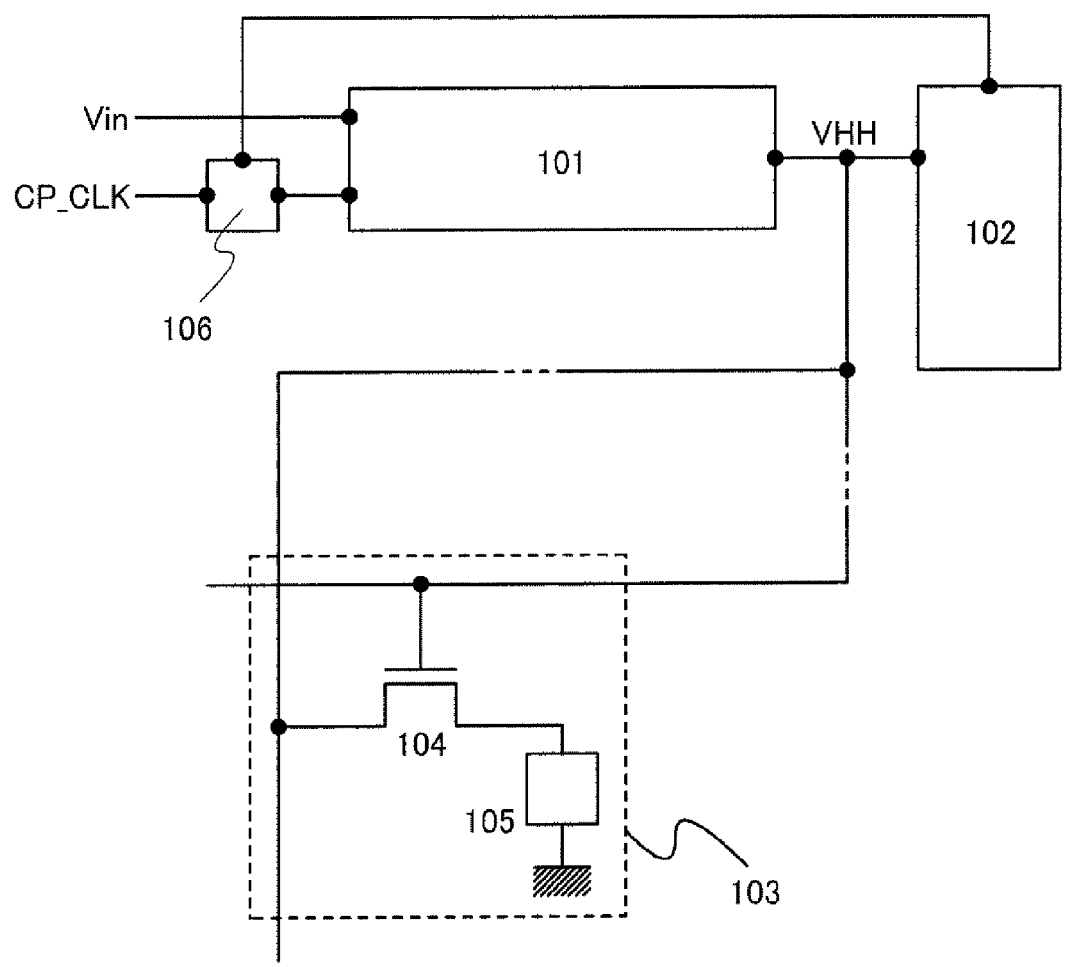
FIG. 1 shows one example of a memory module.

Hereinafter, embodiments and examples will be described in detail with reference to the drawings. Note that in structures of embodiments and examples described below, like portions or portions having like functions are designated by the like reference numerals in different drawings and repeated description thereof may be omitted.

(Embodiment 1)

In Embodiment 1, an example of a structure of a semiconductor memory device will be described with reference to a drawing.

FIG. 1 is a block diagram of one example of a memory module on which an OTP memory is mounted. The memory module in FIG. 1 has a function of feeding back a change in output voltage of a boosting circuit in writing to a signal input to the boosting circuit. In the block diagram in FIG. 1, a boosting circuit 101, a monitor circuit 102, a memory cell 103, and a control circuit 106 are shown. The memory cell 103 includes a transistor 104 and a memory element 105. Although not shown, a capacitor may be connected in parallel to the memory element 105 in order to improve a writing yield.

In a writing operation, the boosting circuit 101 boosts an input voltage (Vin) using a clock signal (CP_CLK) and outputs the boosted voltage as an output voltage (VHH). The output voltage (VHH) of the boosting circuit 101 is applied to the memory element 105 through the transistor 104 in the memory cell 103. If the output voltage (VHH) of the boosting circuit 101 which is applied to the memory element 105 is sufficiently high, the memory element 105 is shorted.

When the memory element 105 is shorted, a value of resistance of the memory element 105 rapidly decreases, leading to a rapid decrease in the output voltage (VHH) of the boosting circuit 101. At this time, the monitor circuit 102 detects the change in the output voltage (VHH) of the boosting circuit 101 and controls the control circuit 106; thus, the clock signal (CP_CLK) input to the boosting circuit 101 is stopped in order to stop a boosting operation of the boosting circuit 101. In addition, the monitor circuit 102 can transmit the signal for controlling the control circuit 106 to a logic circuit which controls the writing operation, so that the writing operation itself on the memory cell 103 can be stopped.

Note that if there are a plurality of memory cells 103, a decoder may be provided in order to select a memory cell into which data is written.

According to Embodiment 1, an operation of the boosting circuit can be stopped immediately after writing into a memory element finishes by controlling the boosting circuit in a manner such that a change in output voltage of the boosting circuit is detected and fed back to the signal input to the boosting circuit. Thus, unnecessary current consumption after a writing operation can be suppressed. In addition, timing of when writing is finished can be detected; therefore, immediately after writing into one memory element finishes, writing into the next memory element starts, which allows optimization of a writing time.

(Embodiment 2)

In Embodiment 2, a more specific structure of a semiconductor memory device will be described with reference to drawings.

Figure 2A:
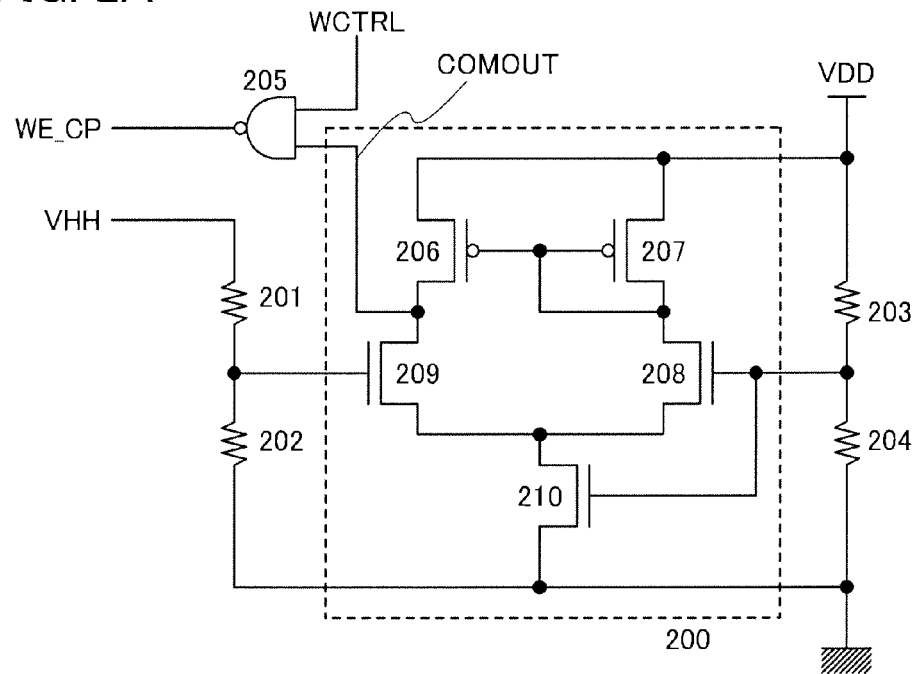
FIGS. 2A and 2B show examples of a monitor circuit and a timing diagram of the monitor circuit.

FIG. 2A is a circuit diagram showing an example of a monitor circuit mounted on the memory module described in Embodiment 1. The circuit in FIG. 2A includes a comparator 200, resistors 201 and 202 for dividing the output voltage (VHH) of the boosting circuit to be input to the comparator 200, resistors 203 and 204 for dividing a power supply voltage (VDD) to be input to the comparator 200 for comparison with the output voltage (VHH) of the boosting circuit, and a NAND gate 205 which outputs the logical NAND of an output (COMOUT) of the comparator 200 and a writing control signal (WCTRL). The comparator 200 includes transistors 206 to 210.

The comparator 200 compares voltages applied to two input terminals (here, a gate electrode of the transistor 208 and a gate electrode of the transistor 209). When one of the voltages is higher than the other, the output (COMOUT) of the comparator 200 is High, while when the other voltage is higher, the output (COMOUT) of the comparator 200 is Low. In Embodiment 2, the two input voltages of the comparator 200 are a voltage obtained by dividing the output voltage (VHH) of the boosting circuit by the resistors 201 and 202 and a voltage obtained by dividing the power supply voltage (VDD) by the resistors 203 and 204 and the two input voltages are compared. Thus, when the output voltage (VHH) of the boosting circuit falls below a predetermined value, the output (COMOUT) of the comparator 200 changes to High.

The value of the output voltage (VHH) of the boosting circuit which makes the output (COMOUT) of the comparator 200 change to High can be arbitrarily set by the power supply voltage (VDD), the ratio between the resistor 201 and the resistor 202, and the ratio between the resistor 203 and the resistor 204. For example, in the case where the power supply voltage (VDD) is 1.5 V, the ratio of the resistor 203 and the resistor 204 is 1:1, and the ratio of the resistor 201 and the resistor 202 is 5:1, when the output voltage (VHH) of the boosting circuit decreases to 4.5 V or lower, the output (COMOUT) of the comparator 200 becomes High. Note that since current flows between an output terminal of the boosting circuit and a grounding line through the resistors 201 and 202 and current flows between a power source and the grounding line through the resistors 203 and 204, each of the resistors 201 to 204 preferably has a resistance of for example, 200 kΩ or more.

The comparator 200 outputs High when the output voltage (VHH) of the boosting circuit is lower than the predetermined value. Therefore, the comparator 200 outputs High not only when after the memory element is shorted, but also in a period of time from when boosting of the voltage is started in writing until the output voltage (VHH) of the boosting circuit reaches the predetermined value. If the output (COMOUT) of the comparator 200 is directly used for controlling the boosting circuit, the boosting circuit stops at the beginning of the boosting operation (because the output voltage (VHH) of the boosting circuit does not reach the reference point) and a writing operation cannot be performed. Accordingly, for a certain period from the beginning of the boosting operation, a control signal which makes the boosting circuit operate regardless of the output voltage (VHH) of the boosting circuit needs to be transmitted to a control circuit.

In Embodiment 2, as an example of the control signal, a writing control signal (WCTRL) is used. The output (COMOUT) of the comparator 200 and the writing control signal (WCTRL) are input to the NAND gate 205 and an output (WE_CP) of the NAND gate 205 is transmitted to the control circuit to control the boosting circuit. Here, the writing control signal (WCTRL) is a signal which is Low for a certain period from the beginning of writing and then changes to High until the writing operation finishes. The certain period may be longer than or equal to the time it takes from when a boosting operation starts until the output voltage (VHH) of the boosting circuit is boosted to a voltage level which can make the output of the comparator 200 Low (e.g., approximately 3 μs to 5 μs).

By using such a signal, it is possible to stop the boosting circuit only when the memory element is shorted and then a decrease in output voltage (VHH) of the boosting circuit is detected. In this manner, current consumption which is caused by an operation of the boosting circuit after the memory element is shorted can be suppressed. In addition, a path-through current which flows between the output terminal of the boosting circuit and the grounding line through the shorted memory element can be suppressed.

It is also acceptable that a signal or address for an operation of the memory be transmitted from the NAND gate 205 as the output (WE_CP) to the logic circuit which controls a writing operation, whereby a change of the output (WE_CP) from Low to High stops the writing operation. Thus, the writing operation can be stopped when the memory element is shorted, which allows optimization of the writing time.

Figure 2B:
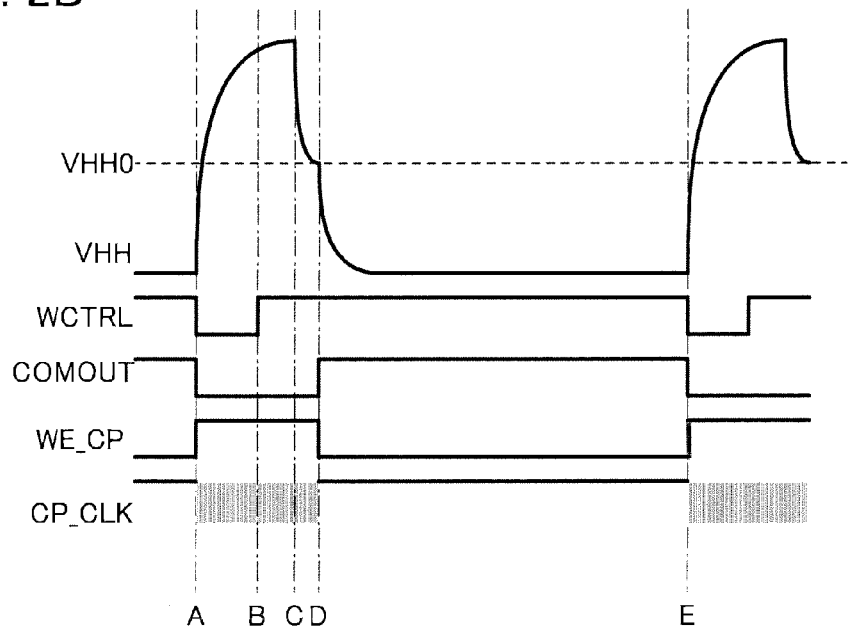

FIG. 2B shows a timing diagram of the monitor circuit in Embodiment 2. Point A shows the time when the writing starts and the output voltage (VHH) of the boosting circuit starts to be increased by the clock signal (CP_CLK) input to the boosting circuit. Point B shows the time when the writing control signal (WCTRL) changes to High. In the period from Point A to Point B, the boosting circuit operates regardless of the output voltage (VHH) of the boosting circuit. Point C shows the time when the memory element is shortened and the output voltage (VHH) of the boosting circuit starts decreasing. Point D shows the time when the decreasing output voltage (VHH) of the boosting circuit falls below the reference point (VHH0), so that the output (COMOUT) of the comparator 200 becomes High. At Point D, both of the output (COMOUT) of the comparator 200 and the writing control signal (WCTRL) change to High, the output (WE_CP) of the NAND gate 205 becomes Low to stop the clock signal (CP_CLK). The clock signal (CP_CLK) remains stopped after the writing operation finishes until writing into the next memory element starts (until Point E). Note that as described above, it is also possible to transmit a change in output (WE_CP) to the logic circuit so as to stop the writing operation itself and omit the period from Point D to Point E.

Note that a structure of the boosting circuit is not particularly limited. As an example, a Dickson charge pump can be used. As an example of the boosting circuit, a Dickson boosting circuit is shown in the circuit diagram of FIG. 3.

Figure 3:
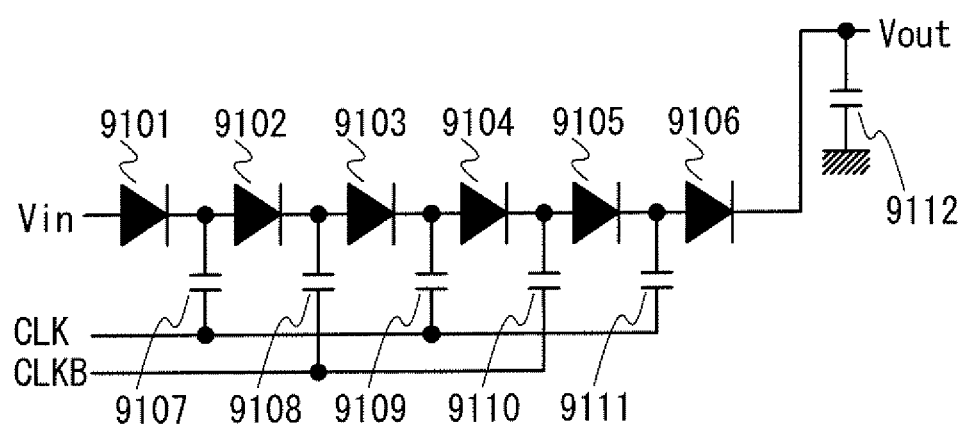
FIG. 3 shows one example of a boosting circuit.

The boosting circuit in FIG. 3 includes diodes 9101 to 9106, capacitors 9107 to 9111 at intermediate stages, and a capacitor 9112 in the last stage. One terminal of the capacitor at an intermediate stage is electrically connected to an output of a diode and the other terminal of the capacitor is electrically connected to a wiring to which the clock signal (CLK) is input or a wiring to which an inverted clock signal (CLKB) is input. An input terminal of the diode 9101 is electrically connected to an input terminal to which an input voltage (Vin) is input. An output terminal of the diode 9106 is electrically connected to an output terminal from which an output voltage (Vout) is output.

The boosting circuit includes plural pairs of the diode and the capacitor which is electrically connected to the output of the diode. Specifically, the boosting circuit includes five pairs: the diode 9101 and the capacitor 9107 at an intermediate stage, the diode 9102 and the capacitor 9108 at an intermediate stage, the diode 9103 and the capacitor 9109 at an intermediate stage, the diode 9104 and the capacitor 9110 at an intermediate stage, and the diode 9105 and the capacitor 9111 at an intermediate stage. The other terminals of the capacitors 9107 to 9111 are electrically connected to the wiring to which the clock signal (CLK) is input or to the wiring to the inverted clock signal (CLKB) is input. To the capacitors at intermediate stages, the clock signal (CLK) or the inverted clock signal (CLKB) are input in a manner such that neighboring capacitors receive different signals. The clock signal (CLK) is input to the capacitors 9107, 9109, and 9111 at intermediate stages and the inverted clock signal (CLKB) is input to the capacitors 9108 and 9110 at intermediate stages.

An operation of the boosting circuit in FIG. 3 will be described below.

At an electrical connection between the output of the diode 9101 and the capacitor 9107 at an intermediate stage, a signal (the input voltage (Vin)) input from the input terminal is boosted by the amplitude of the clock signal (CLK) and is input to the diode 9102 every time when the clock signal (CLK) transitions from a low level to a high level. A potential at an electrical connection between the output of the diode 9102 and the capacitor 9108 at an intermediate stage is a potential which is lower than the potential at the electrical connection between the output of the diode 9101 and the capacitor 9107 at an intermediate stage by the threshold voltage of the diode 9102. When the clock signal (CLK) transitions from the high level to the low level, a potential at the electrical connection between the output of the diode 9101 and the capacitor 9107 at an intermediate stage returns to the level of the input voltage (Vin) of the input terminal, but the potential which has passed through the diode 9102 is not decreased and maintained because of the diode 9102.

At the electrical connection between the output of the diode 9102 and the capacitor 9108 at an intermediate stage, a signal is boosted from the level of {(the input voltage (Vin) of the input terminal)+(the amplitude of the clock signal (CLK))−(the threshold voltage of the diode 9102)} by the amplitude of the inverted clock signal (CLKB) and is input to the diode 9103 every time when the inverted clock signal (CLKB) transitions from a low level to a high level. A potential at an electrical connection between the output of the diode 9103 and the capacitor 9109 at an intermediate stage is a potential which is lower than the level of {(the input voltage (Vin) of the input terminal)+(the amplitude of the clock signal (CLK))+(the amplitude of the inverted clock signal (CLKB))−(the threshold voltage of the diode 9102)} by the threshold voltage of the diode 9103. When the inverted clock signal (CLKB) transitions from the high level to the low level, a potential at the electrical connection between the output of the diode 9102 and the capacitor 9108 at an intermediate stage returns to the level of {(the input voltage (Vin) of the input terminal)+(the amplitude of the clock signal (CLK))−(the threshold voltage of the diode 9102)}, but a potential at the electrical connection between the output of the diode 9103 and the capacitor 9109 at an intermediate stage is not decreased and maintained because of the diode 9103.

In this manner, as one pair of the diode and the capacitor at an intermediate stage is added, an output voltage increases stepwise.

By using the monitor circuit according to Embodiment 2, an operation of the boosting circuit can be stopped immediately after writing into a memory element finishes by controlling an operation of the boosting circuit in a manner such that a change in output voltage of the boosting circuit is detected and fed back to the signal input to the boosting circuit in FIG. 3. Thus, unnecessary current consumption after a writing operation can be suppressed. In addition, after writing into one memory element finishes, writing into the next memory element starts, which allows optimization of a writing time.

(Embodiment 3)

In Embodiment 3, a more specific structure of a semiconductor memory device according to one embodiment of the present invention will be described with reference to drawings.

Figure 6:
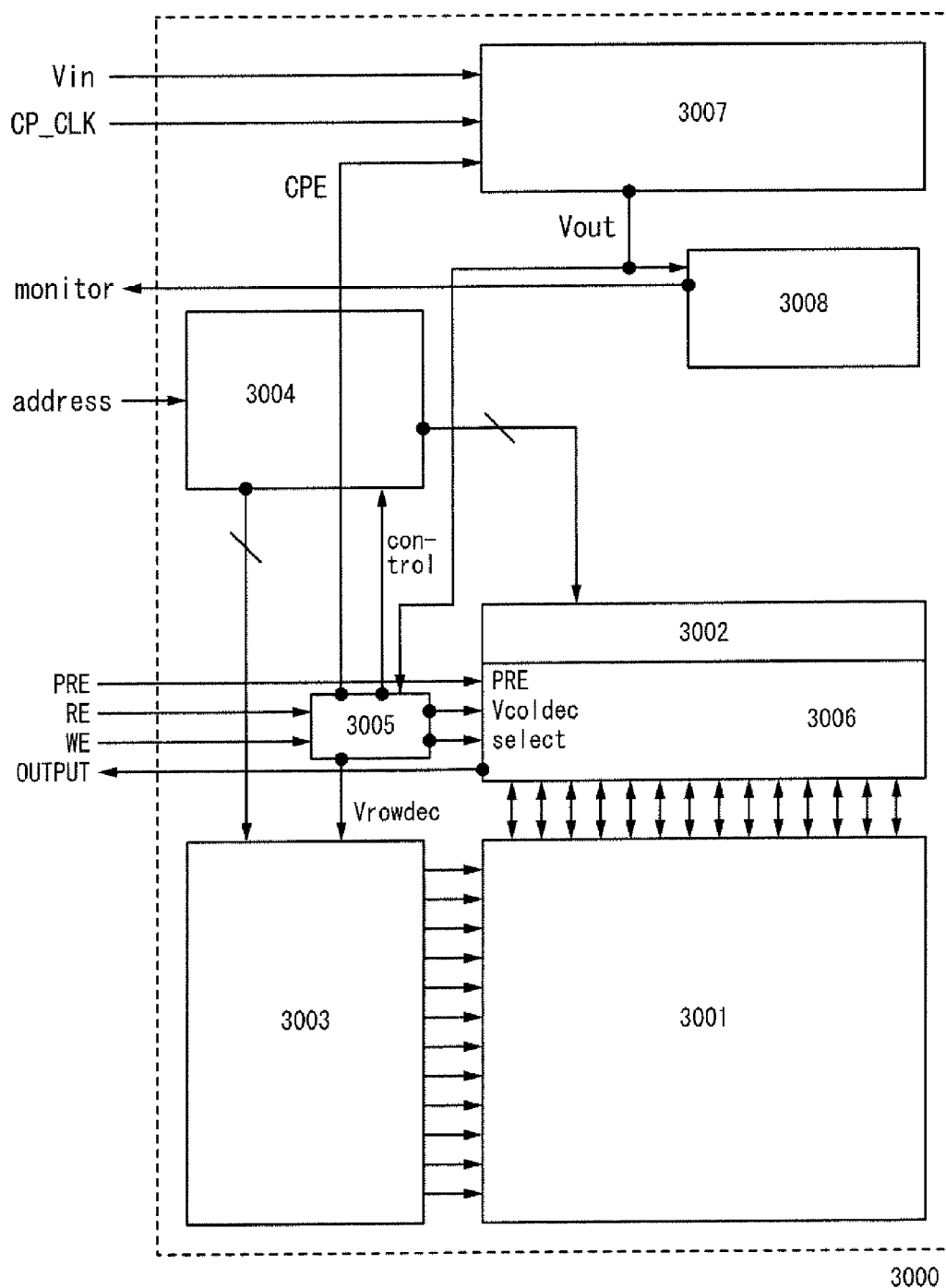
FIG. 6 shows one example of a memory circuit.

FIG. 6 is a block diagram of an example of a memory circuit in which memory cells and circuits necessary for driving the memory cells are modularized. As illustrated in FIG. 6, a memory circuit 3000 includes a memory cell array 3001, a column decoder 3002, a row decoder 3003, an address selector 3004, a selector 3005, a reading/writing circuit 3006, a boosting circuit 3007, and a monitor circuit 3008. Here, the memory cell array 3001 includes a plurality of memory cells arranged in a matrix.

Next, the operation of the memory circuit 3000 will be described. To the memory circuit 3000, a read enable signal (RE), a write enable signal (WE), an address signal (address), and a clock signal (CP_CLK) which is supplied to the boosting circuit are input as operation signals, and the input voltage (Vin) for the boosting circuit is applied as a power source. Note that although not particularly shown, a voltage necessary for driving the circuits, such as a power supply voltage (VDD) and a power supply voltage (GND), is also applied as a power source for operations.

The read enable signal (RE) and the write enable signal (WE) are input to the selector 3005 to determine the operation of the memory. For example, when the read enable signal (RE) is active and the write enable signal (WE) is non-active, a reading operation is performed. When the write enable signal (WE) is active and the read enable signal (RE) is non-active, a writing operation is performed. When the write enable signal (WE) and the read enable signal (RE) are both non-active, the memory is in a standby state.

In the writing operation, it is also acceptable that the selector 3005 generates a boost enable signal (CPE, charge pump enable signal) and an output of the boost enable signal (CPE) is set as a requirement for the operation of the boosting circuit. Thus, current consumption due to an unnecessary boosting operation can be suppressed. Further, in the writing operation or the reading operation, if the selector 3005 generates a control signal (control) to be input to the address selector 3004, a malfunction due to driving of the decoder in the standby state can be prevented.

The address signal (address) is divided through the address selector 3004 and is input to the column decoder 3002 and the row decoder 3003. Each of the column decoder 3002 and the row decoder 3003 includes plural decoders. In each of the column decoder 3002 and the row decoder 3003, only one of the plural decoders is driven in accordance with a combination of values of the address signal (address). In accordance with a combination of the decoders which are driven, a memory cell for writing or reading is uniquely determined in the memory cell array 3001. As described above, in the state where neither writing nor reading is performed, a signal input to the column decoder 3002 and a signal input to the row decoder 3003 are preferably made non-active by the control signal (control) generated in the selector 3005 so that the decoder is not selected.

The reading/writing circuit 3006 which is connected to the column decoder 3002 receives a selection signal (select) generated by the selector 3005 to drive either a reading circuit or a writing circuit in the reading/writing circuit 3006. The writing circuit may be driven in a writing state, and the reading circuit may be driven in a reading state.

The writing circuit includes a level shifter and a buffer. A voltage of the signal selected by the column decoder 3002 is boosted by the level shifter and input to a bit line through the buffer as a writing voltage. A memory element is shorted by the voltage input to the bit line; thus, writing into the memory element is performed. At this time, an output of the boosting circuit 3007 decreases. The change in output voltage of the boosting circuit 3007 can be detected by the monitor circuit 3008 and feedback on the change can be provided.

The reading circuit reads either data "0" or data "1" froze the potential of the bit line of the accessed memory cell and outputs the data as data output (OUTPUT).

The boosting circuit 3007 is operated by the clock signal (CP_CLK), which is an input signal from the outside, when the boost enable signal (CPE) generated in the selector 3005 is active, and the boosting circuit 3007 amplifies the input voltage (Vin) applied from the outside as a power source and outputs the output voltage (Vout). The output voltage (Vout) is input to the selector 3005, and the selector 3005 applies a power supply voltage (Vcoldec) of the reading/writing circuit 3006 and a power supply voltage (Vrowdec) of the row decoder 3003 respectively to the column decoder 3002 and the row decoder 3003 when the circuit performs a writing operation. The voltage of the selected bit line and word line is increased by the level shifter so as to be sufficiently high to make the memory element shorted. Note that as the structure of the boosting circuit 3007, a known structure may be used. For example, the boosting circuit in FIG. 3 can be employed.

In the structure in Embodiment 3, description in Embodiment 1 can be applied to the boosting circuit 3007 and the monitor circuit 3008. Further, description in Embodiment 2 can be applied to the boosting circuit 3007 and the monitor circuit 3008. By employing the description in Embodiment 1, a boosting operation can be stopped immediately after the memory element is shorted in a writing operation. Thus, unnecessary current consumption which is caused by an operation of the boosting circuit after the memory element is shorted can be suppressed. In addition, an adverse effect on the shorted memory element which is caused by continuous application of current to the shorted memory element can be prevented.

By transmission of the output of the monitor circuit 3008 to a logic circuit controlling the writing operation, it is possible to stop the writing operation and perform a writing operation on the next memory element immediately after the memory element is shorted. Thus, optimization of a writing time can be achieved. Further, by monitoring a change in output voltage of the boosting circuit which is caused when the memory element is shorted, writing into the memory element can be detected. Thus, a reading operation for determining whether data is properly written in writing becomes unnecessary. Therefore, logic of the writing operation on the memory element can be simplified, whereby current consumption can be reduced and a circuit area can be smaller.

(Embodiment 4)

In Embodiment 4, a semiconductor device on which a semiconductor memory device according to one embodiment of the present invention is mounted will be described with reference to a drawing.

The semiconductor device in this embodiment includes a memory circuit, stores necessary information in the memory circuit, and exchanges information with the outside by using a contactless means, for example, wireless communication. Such a semiconductor device is also referred to as a non-contact data processing device. Utilizing this feature, the semiconductor device in Embodiment 4 has an application of an individual authentication system by which individual information of articles or the like is stored, and the information is read to identify the articles. In order to be used in this application, a device for storing data of the individual information and identifying the articles should have higher reliability.

Figure 7:
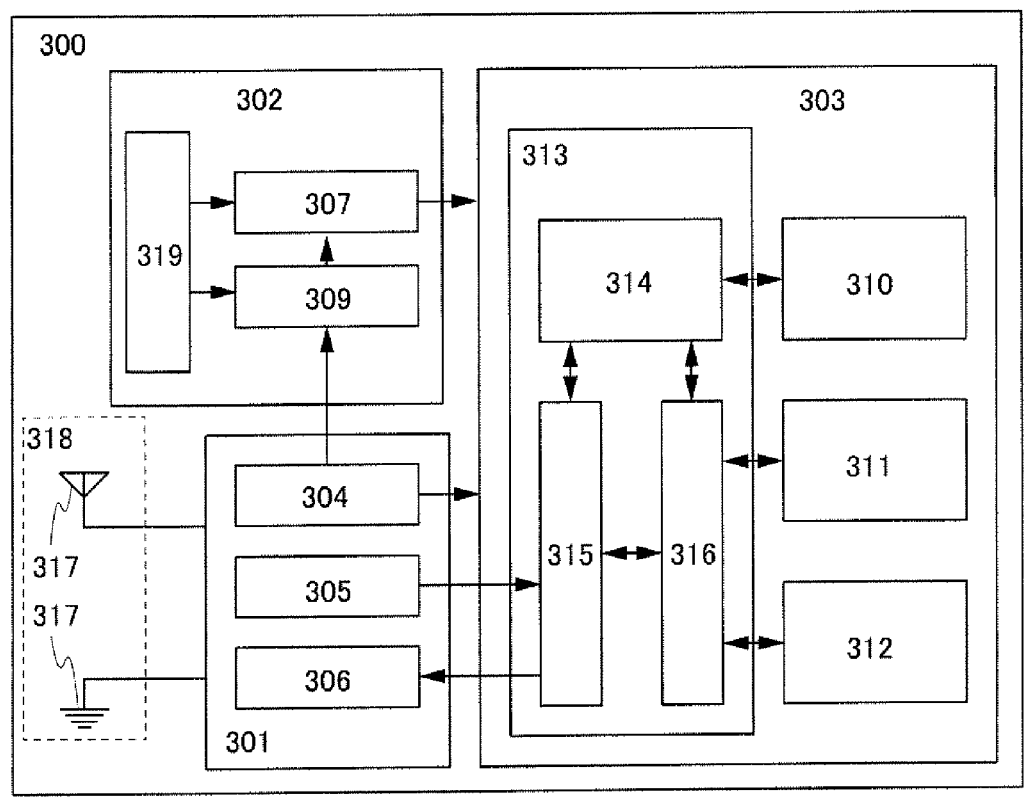
FIG. 7 shows one example of a non-contact data processing device.

As an example of the semiconductor device, an RFID tag will be described below. FIG. 7 shows a non-contact data processing device which is an example of the RFID tag on which a semiconductor memory device is mounted. FIG. 7 is a block diagram showing one example of non-contact data processing device.

As illustrated in FIG. 7, a non-contact data processing device 300 includes a wireless communication circuit 301, a clock generation circuit 302, a logic circuit 303, and an antenna portion 318 including an antenna 317. Note that although not shown, the non-contact data processing device 300 transmits and receives wireless signals to and from an external circuit such as a wireless communication device through the antenna 317. Note that data transmission methods are roughly classified into the following three methods: an electromagnetic coupling method by which a pair of coils is provided so as to be faced with each other and communicates with each other by mutual induction, an electromagnetic induction method by which communication is performed using an induction field, and an electromagnetic wave method by which communication is performed using an electromagnetic wave. Any of these methods can be used in Embodiment 4.

Next, the structure of each circuit is described. The wireless communication circuit 301 includes a power supply circuit 304, a demodulation circuit 305, and a modulation circuit 306. The clock generation circuit 302 includes a frequency divider circuit 307, a counter circuit 309, and a reference clock generation circuit 319. The logic circuit 303 has a function of performing arithmetic processing and includes a controller 313, a CPU (also referred to as a central processing unit) 310, a read only memory (ROM) 311, and a random access memory (RAM) 312.

The controller 313 includes a CPU interface 314, an RF interface 315, and a memory controller 316.

Further, in the wireless communication circuit 301, the power supply circuit 304 includes a rectifier circuit and a storage capacitor and has a function of generating a power supply voltage from received signals and supplying the power supply voltage to other circuits. The demodulation circuit 305 includes a rectifier circuit and a low pass filter (LPF) and has a function of extracting a command or data from communication signals. The modulation circuit 306 has a function of modulating transmission data, and the modulated data is transmitted as a transmission signal from the antenna 317.

Next, the operation of the non-contact data processing device is described. First, a signal transmitted from an external communication device is received through the antenna portion 318. The received signal which is input to the non-contact data processing device is demodulated by the demodulation circuit 305 and then input to the RF interface 315 in the controller 313. The received signal which is input to the RF interface 315 is subjected to arithmetic processing by the CPU 310 through the CPU interface 314. In addition, with the received signal which is input to the RF interface 315, access to the ROM 311 and the RAM 312 is performed through the memory controller 316.

Then, after arithmetic processing is performed by the CPU 310 and data is input and output to and from the ROM 311 and the RAM 312, transmission data is generated. The transmission data is modulated as a signal by the modulation circuit 306 and is transmitted from the antenna 317 to the external communication device.

The semiconductor memory device according to one embodiment of the present invention can be mounted as the ROM 311, the RAM 312, or another memory circuit in the non-contact data processing device in Embodiment 4. By mounting the semiconductor memory device according to one embodiment of the present invention, a smaller non-contact data processing device can be provided. Further, since the semiconductor memory device according to one embodiment of the present invention can be manufactured at low cost, manufacturing cost of the non-contact data processing device can be reduced.

Note that Embodiment 4 can be combined as appropriate with any of other embodiments.

(Embodiment 5)

In Embodiment 5, a method for manufacturing a semiconductor device on which a semiconductor memory device according to one embodiment of the present invention is mounted will be described with reference to drawings.

A structural example of the semiconductor device in Embodiment 5 will be described with reference to FIGS. 8A and 8B. Here, FIG. 8A is a schematic view showing the structure of the semiconductor device in Embodiment 5, and FIG. 8B is a cross-sectional view taken along line A-B in FIG. 8A.

Figure 8A:
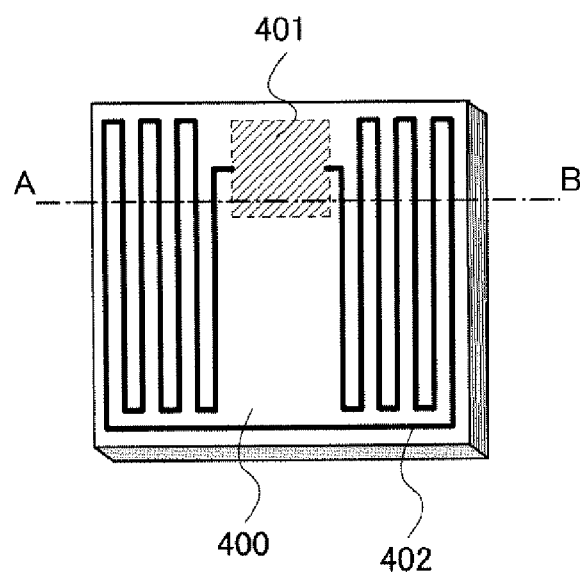
FIGS. 8A and 8B show a structural example of a semiconductor device.

As illustrated in FIG. 8A, the semiconductor device in Embodiment 5 includes a substrate 400, an element portion 401 which is provided over the substrate 400, and an antenna 402 which is electrically connected to the element portion 401.

The element portion 401 includes a plurality of elements such as a memory element and has a function of processing signals received from the outside. The antenna 402 has a function of transmitting data in the semiconductor device.

Figure 8B:
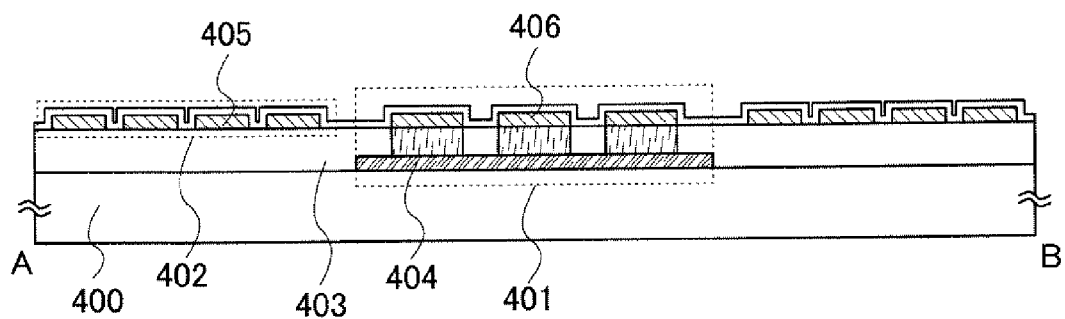

Further, as illustrated in FIG. 8B, the semiconductor device in Embodiment 5 includes an element 404 over the substrate 400, an interlayer film 403 over the element 404 and the substrate 400, a conductive film 405 which functions as the antenna over the interlayer film 403, and a conductive film 406 which is electrically connected to the element 404. The element portion 401 includes the element 404 and the conductive film 406.

Note that although the conductive film 405 which serves as the antenna is provided in the same layer as the conductive film 406 in the structure of FIG. 8B, there is no limitation. A structure can be employed in which the element portion 401 is provided, an insulating film is additionally provided so as to cover the element portion and the conductive film 405 is provided over the insulating film.

Figure 9A:
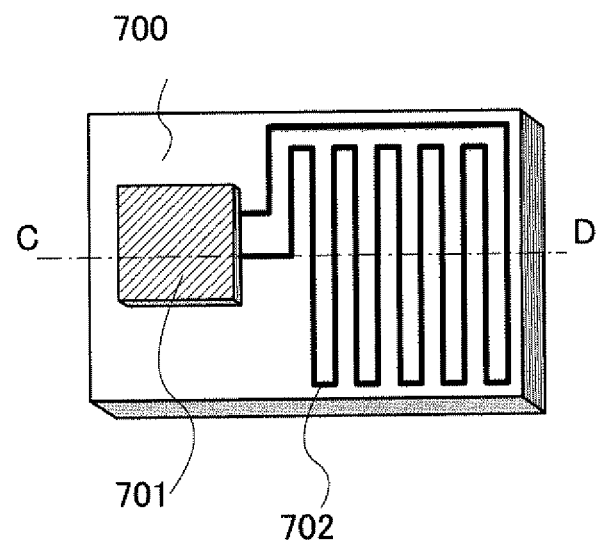
FIGS. 9A and 9B show a structural example of a semiconductor device.

Furthermore, the structure of the semiconductor device of Embodiment 5 is not limited to the structure of FIGS. 8A and 8B. A different structural example of the semiconductor device of Embodiment 5 is described with reference to FIGS. 9A and 9B. FIG. 9A is a schematic view showing another structure of the semiconductor device in Embodiment 5, and FIG. 9B is a cross-sectional view taken along line A-B in FIG. 9A.

As illustrated in FIG. 9A, the semiconductor device in Embodiment 5 includes a substrate 700, an element portion 701 over the substrate 700, and an antenna 702 which is electrically connected to the element portion 701.

As in the structure of FIG. 8A, the element portion 701 includes a plurality of elements such as a memory element and has a function of processing signals received from the outside. The antenna 702 has a function of transmitting data in the semiconductor device.

Figure 9B:
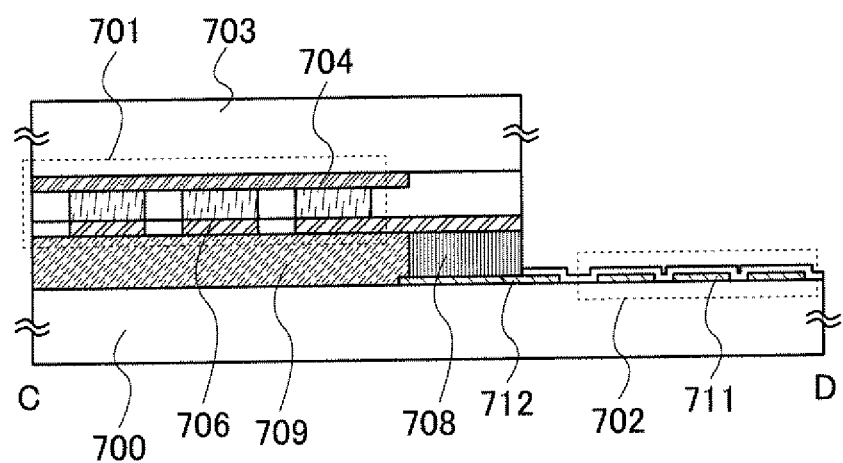

FIG. 9B shows an example of a cross sectional structure taken along line C-D in FIG. 9A. The semiconductor device in Embodiment 5 includes the substrate 700, a conductive film 711 serving as the antenna 702, a connection wiring 712, and a resin 709 which are provided over part of the substrate 700, a anisotropic conductive layer 708 including a conductive particle which is provided over part of the connection wiring 712, a conductive film 706 which is provided over part of the resin 709 and part of the anisotropic conductive layer 708, the element portion 701 including an element 704 which is provided over the conductive film 706, and a substrate 703 which is provided over the element portion 701.

In the case of the structure of FIG. 9B, a terminal portion is provided. The conductive film 706 is used as the terminal portion. In addition, the substrate 703 on which the element portion 701 and the conductive film 706 are provided is attached to the substrate 700 provided with the antenna 702 so that the conductive film 706 and the conductive film 711 are electrically connected to each other through the anisotropic conductive layer 708.

In Embodiment 5, the semiconductor memory device according to one embodiment of the present invention can be used as the memory element in the element portion 401 in FIGS. 8A and 8B and the element portion 701 in FIGS. 9A and 9B. By using the semiconductor memory device according to one embodiment of the present invention, a semiconductor device having high reliability can be manufactured at low cost.

If a plurality of the element portions 401 in FIGS. 5A and 813 or a plurality of the element portions 701 in FIGS. 9A and 9B are formed over a large substrate and then the substrate is cut to provide individual element portions, the element portion 401 or the element portion 701 can be formed at low cost. As the substrate 400 and the substrate 403 in FIGS. 8A and 8B and the substrate 700 and the substrate 703 in FIGS. 9A and 9B used in this case, a glass substrate, a quartz substrate, a ceramic substrate, a metal substrate (e.g., a stainless steel substrate), a semiconductor substrate (e.g., a silicon substrate), or the like can be used. Alternatively, a flexible substrate formed using polyethylene terephthalate (PET), polyethylene naphthalate (PEN), polyether sulfone (PES), acrylic, or the like can be used as a plastic substrate, for example.

A plurality of transistors, memory devices, and the like which are included in the element portion 401 in FIGS. 8A and 8B and the element portion 701 in FIGS. 9A and 9B are not limited to being provided in one layer, and can be provided in a plurality of layers. When the element portion 401 in FIGS. 8A and 8B and the element portion 701 in FIGS. 9A and 9B are provided in a plurality of layers, an interlayer insulating film is used. As the material of the interlayer insulating film, a resin material such as an epoxy resin or an acrylic resin, a light-transmitting resin material such as a polyimide resin, a compound material which includes a siloxane material, such as a siloxane resin, a material which contains a water-soluble homopolymer and a water-soluble copolymer, or an inorganic material can be used. The interlayer insulating film may have a stack-layer structure by selecting plural kinds of the any of those materials. A siloxane material is a material including a Si—O—Si bond. Siloxane has a skeleton structure formed of a bond of silicon (Si) and oxygen (O). As a substituent of siloxane, an organic group (e.g., an alkyl group or aromatic hydrocarbon) or a fluoro group may be used. An organic group may have a fluoro group. The interlayer insulating film can be formed by a CVD method, a sputtering method, a SOG method, a droplet discharge method, a screen printing method, or the like.

Moreover, as the material of the interlayer insulating film, a material with low dielectric constant is preferably used in order to reduce parasitic capacitance generated in the interlayer insulating film. When the parasitic capacitance is reduced, a high-speed operation and reduction in power consumption can be realized.

The conductive film 405 and the conductive film 406 in FIG. 8B and the conductive film 706 and the conductive film 711 in FIG. 9B can be formed by a CVD method, a sputtering method, a printing method such as a screen printing method or a gravure printing method, a droplet discharge method, a dispenser method, a plating method, or the like. As a material of the conductive film 405 and the conductive film 406 in FIG. 8B and the conductive film 706 and the conductive film 711 in FIG. 9B, an element selected from aluminum, titanium, silver, copper, gold, platinum, nickel, palladium, tantalum, or molybdenum, or an alloy material or a compound material which contains any of those elements as its main component can be used. These conductive films can be formed with a single-layer structure or a layered structure.

For example, in the case of forming the conductive film 405 and the conductive film 406 in FIG. 8B and the conductive film 706 and the conductive film 711 in FIG. 9B by a screen printing method, they can be formed by selectively printing a conductive paste in which conductive particles having a grain diameter of several nanometers to several tens of micrometers are dissolved or dispersed in an organic resin. As the conductive particles, metal particles of one or more of silver, gold, copper, nickel, platinum, palladium, tantalum, molybdenum, titanium, and the like; fine particles of silver halide; or dispersible nano particles can be used. Further, as the organic resin included in the conductive paste, one or more of organic resins serving as a binder, solvent, dispersible agent, and coating material of metal particles can be used. Typically, an organic resin such as an epoxy resin or a silicone resin can be used. Further, in formation of the conductive films, baking is preferably performed after the conductive paste is applied. For example, in the case of using a fine particle (e.g., particles with a grain diameter of 1 nm or more and 100 nm or less) containing silver as its main component as the material of the conductive paste, the conductive film can be formed by baking the conductive paste at temperatures within the range of from 150° C. to 300° C. so that the conductive paste is cured. Alternatively, a fine particle which includes solder or lead-free solder as its main component may be used as a fine particle. In this case, a fine particle having a grain diameter of 20 μm or less is preferably used. By using solder or lead-free solder, the conductive films can be formed at low cost.

When the semiconductor memory device or the like is provided in the element portion 401 in FIGS. 8A and 8B and the element portion 701 in FIGS. 9A and 9B, for example, a transistor in the element portions can include a semiconductor layer formed with a single-layer structure or a layered structure of any of an amorphous semiconductor, a microcrystalline semiconductor (also referred to as a microcrystal semiconductor), a polycrystalline semiconductor, an organic semiconductor, and the like as an active layer. In order to obtain a transistor with favorable characteristics, an active layer which is crystallized by using a metal element as a catalyst or an active layer which is crystallized by laser irradiation is preferably used. Alternatively, as an active layer, a semiconductor layer which is formed by a plasma CVD method by using a $SiH_4/F_2$ gas or a $SiH_4/H_2$ gas (an Ar gas), or a semiconductor layer which is irradiated with a laser can be used.

Further, the transistor included in the element portion 401 in FIGS. 8A and 8B and the element portion 701 in FIGS. 9A and 9B can include a crystalline semiconductor layer (a low temperature polysilicon layer) which is obtained by crystallization at a temperature of 200° C. to 600° C. (preferably 350° C. to 500° C.) or a crystalline semiconductor layer (a high temperature polysilicon layer) which is obtained by crystallization at a temperature of 600° C. or higher. Note that in the case where a high temperature polysilicon layer is formed over a substrate, a quartz substrate is preferably used because a glass substrate is sensitive to heat in some cases.

Hydrogen or a halogen element is preferably added to the active layer (particularly a channel region) of the transistor included in the element portion 401 in FIGS. 8A and 8B and the element portion 701 in FIGS. 9A and 9B at a concentration of $1 \times 10^{19}$ atoms/cm$^3$ to $1 \times 10^{22}$ atoms/cm$^3$, preferably a concentration of $1 \times 10^{19}$ atoms/cm$^3$ to $5 \times 10^{20}$ atoms/cm$^3$. By adding hydrogen or a halogen element, an active layer with fewer defects, in which cracks are not easily generated, can be obtained.

Further, it is preferable to provide a barrier film which blocks contaminant such as an alkali metal so as to wrap the transistor included in the element portion 401 in FIGS. 8A and 8B and the element portion 701 in FIGS. 9A and 9B or the element portion 401 in FIGS. 8A and 8B and the element portion 701 in FIGS. 9A and 9B. By providing the barrier film, the element portion 401 in FIGS. 8A and 8B and the element portion 701 in FIGS. 9A and 9B which are not contaminated and have higher reliability can be provided. Note that a silicon nitride film, a silicon nitride oxide film, a silicon oxynitride film, or the like can be used as the barrier film. Further, the thickness of the active layer of the transistor included in the element portion 401 in FIGS. 8A and 8B and the element portion 701 in FIGS. 9A and 9B is 20 nm to 200 nm, preferably 40 nm to 170 nm, more preferably 45 nm to 55 nm or 145 nm to 155 nm, and further more preferably 50 nm or 150 nm. By setting the thickness of the active layer in the above range, the element portion 401 and the element portion 701 in which cracks are not easily generated even when being bent can be provided.

Further, it is preferable that crystals which are included in the active layer of the transistor included in the element portion 401 in FIGS. 8A and 8B and the element portion 701 in FIGS. 9A and 9B be formed so as to have a crystal boundary extending in parallel to a direction in which carries flow (a channel length direction). Such an active layer may be formed using a continuous wave laser, or a pulsed laser which is operated at 10 MHz or higher, preferably 60 MHz to 100 MHz.

Furthermore, the transistor included in the element portion 401 in FIGS. 8A and 8B and the element portion 701 in FIGS. 9A and 9B preferably have characteristics of an S value (a subthreshold swing value) of 0.35 V/dec or less (preferably 0.09 V/dec to 0.25 V/dec) and a mobility of 10 cm$^2$/Vs or higher. Such characteristics can be realized when the active layer is formed by using a pulsed laser which is operated at 10 MHz or higher or a continuous wave laser.

Further, the transistor included in the element portion 401 in FIGS. 8A and 8B and the element portion 701 in FIGS. 9A and 9B has a frequency of 1 MHz or higher, preferably 10 MHz or higher (at 3 V to 5 V) at the ring oscillator level or 100 kHz or higher, preferably 1 MHz or higher (at 3 V to 5 V) per transistor.

Figure 10A:
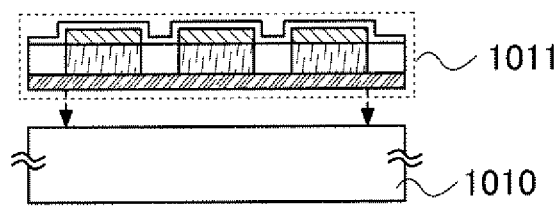
FIGS. 10A to 10C show a structural example of a semiconductor device.
Figure 10B:
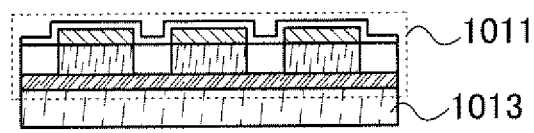
Figure 10C:
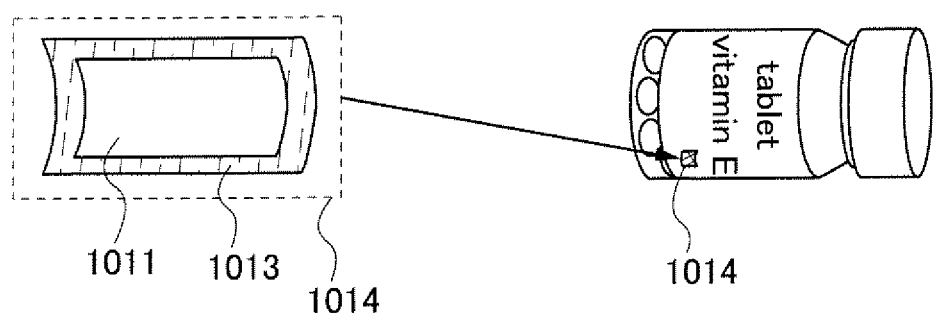

The substrate over which the element portion is formed can be used as it is for the semiconductor device, but the semiconductor device disclosed in Embodiment 5 is not limited to this. FIGS. 10A to 10C show an example where another substrate is used in addition to the substrate over which the element portion is formed. FIGS. 10A to 10C are schematic views illustrating another structural examples of the semiconductor device in Embodiment 5.

As illustrated in FIG. 10A, from a substrate 1010 over which an element portion 1011 is formed, the element portion 1011 over the substrate 1010 is separated. Further, as illustrated in FIG. 10B, the separated element portion 1011 can be attached to a substrate 1013 which is different from the substrate 1010. Note that as the substrate 1013, a flexible substrate can be used, for example.

The element portion 1011 can be separated from the substrate 1010 by any of the following methods, for example: a method in which a metal oxide film is provided between the substrate 1010 having high heat resistance and the element portion 1011 and the metal oxide film is crystallized to be weakened so that the element portion 1011 is separated; a method in which an amorphous silicon film containing hydrogen is provided between the substrate 1010 having high heat resistance and the element portion 1011 and the amorphous silicon film is removed by laser beam irradiation or etching so that the element portion 1011 is separated; and a method in which the substrate 1010 having high heat resistance over which the element portion 1011 is formed is removed mechanically or by etching with a solution or a gas such as $CF_3$ so that the element portion 1011 is separated.

As an alternative to the above method, it is possible to separate the element portion 1011 from the substrate 1010 by a physical means using a separation layer provided between the element portion 1011 and the substrate 1010 which is formed of a metal film (e.g., a film of tungsten, molybdenum, titanium, tantalum, or cobalt), a metal oxide film (e.g., a film of tungsten oxide, molybdenum oxide, titanium oxide, tantalum oxide, or cobalt oxide), or a layered structure of a metal film and a metal oxide film. Alternatively, a method can be employed in which an opening is formed to expose part of the separation layer, the separation layer is partly removed with an etching agent such as halogen fluoride (e.g., $ClF_3$), and then the element portion 1011 is physically separated from the substrate 1010.

Further, the separated element portion 1011 may be attached to the substrate 1013 by using a commercially available adhesive, for example, an epoxy resin-based adhesive or a resin additive.

When the semiconductor device is manufactured as described above by attaching the element portion 1011 and the substrate 1013, a semiconductor device which is thin, lightweight, and is not easily broken even when it is dropped can be provided. Further, if a flexible substrate is used as the substrate 1013, the semiconductor device can be attached to a curved surface or an irregular shape, whereby a variety of applications are realized. For example, as illustrated in FIG. 10C, a semiconductor device 1014 disclosed in Embodiment 5 can be tightly attached to a curved surface of a medicine bottle, for example. Moreover, when the substrate 1010 is reused, the semiconductor device can be provided at lower cost.

Note that Embodiment 5 can be combined as appropriate with any of other embodiments.

(Embodiment 6)

In Embodiment 6, a method for manufacturing a flexible semiconductor device on which the semiconductor memory device according to one embodiment of the present invention can be mounted will be described with reference to drawings.

An example of a manufacturing method and structure of the semiconductor device in Embodiment 6 will be described with reference to FIGS. 11A to 11C.

Figure 11A:
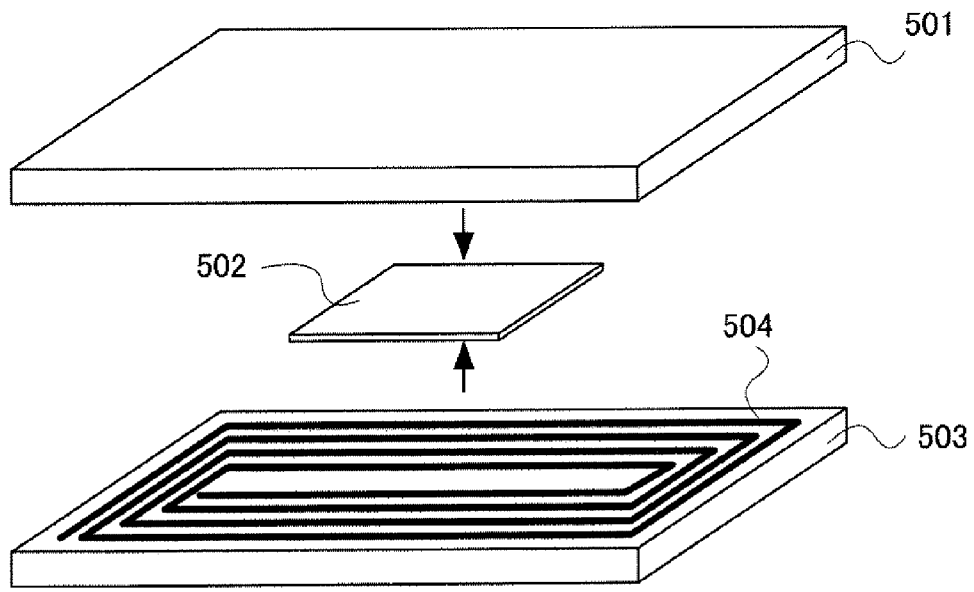
FIGS. 11A to 11C show a manufacturing method and a structural example of a semiconductor device.

As illustrated in FIG. 11A, the semiconductor device in Embodiment 6 includes a flexible protective layer 501, a flexible protective layer 503 having an antenna 504, and an element portion 502 which is formed using a separation process. The antenna 504 which is formed over the protective layer 503 is electrically connected to the element portion 502 by attachment of the element portion 502 and the protective layer 503. Although the antenna 504 is formed only over the protective layer 503 in the structure in FIG. 11A, an embodiment of the present invention is not limited thereto. The antenna 504 can be provided over the protective layer 501. In addition, by forming a barrier film formed using a silicon nitride film or the like between the element portion 502 and the protective layers 501 and between the element portion 502 and the protective layer 503, contamination of the element portion 502 can be prevented; thus, a semiconductor device having higher reliability can be provided.

For a conductive film which serves as the antenna 504, any of the materials given in Embodiment 4 can be used. Note that although the element portion 502 and the antenna 504 are connected to each other by UV treatment or ultrasonic treatment with an anisotropic conductive film or the like, the connection method is not limited to this. The element portion 502 and the antenna 504 can be connected to each other by a variety of methods.

Figure 11B:
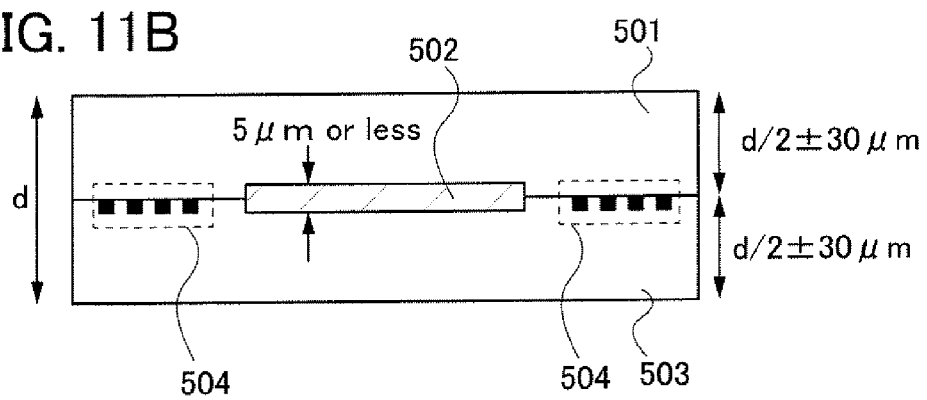

As illustrated in FIG. 11B, the thickness of the element portion 502 which is interposed between the protective layers 501 and 503 is preferably 5 μm or less, more preferably 0.1 μm to 3 μm. In addition, when the thickness of the protective layers 501 and 503 which are superposed is denoted by d, the thickness of each of the protective layers 501 and 503 is preferably (d/2)±30 μm, more preferably (d/2)±10 μm. Further, the thickness of each of the protective layers 501 and 503 is preferably 10 μm to 200 μm. Furthermore, the area of the element portion 502 is 5 mm square (25 mm$^2$) or less, preferably 0.3 mm square (0.09 mm$^2$) to 4 mm square (16 mm$^2$).

Since the protective layers 501 and 503 are formed using an organic resin material, the protective layers 501 and 503 have high resistance against bending. Further, the element portion 502 which is formed using the separation process has high resistance against bending as compared to a common element manufactured using a single crystal semiconductor. The element portion 502 can be tightly attached to the protective layers 501 and 503 without space therebetween; therefore, the resulting semiconductor device has high resistance against bending. The element portion 502 which is surrounded by the protective layers 501 and 503 may be provided on a surface of or inside another object, or may be embedded in paper.

Next, the case where the element portion which is formed using the separation process is attached to an object having a curved surface is described.

When the element portion is attached to an object having a curved surface, a change in electrical characteristic is expected because tension and compression stress is applied to a channel region of transistor as it is bent.

Figure 11C:
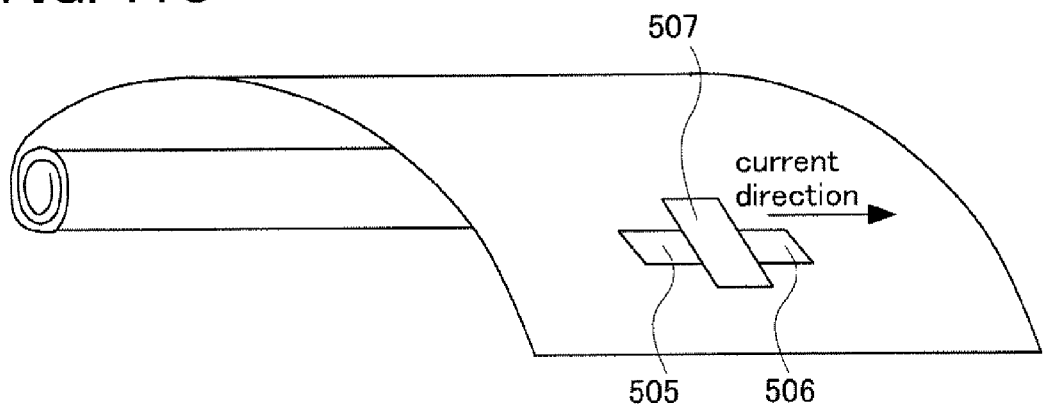
Figure 12A:
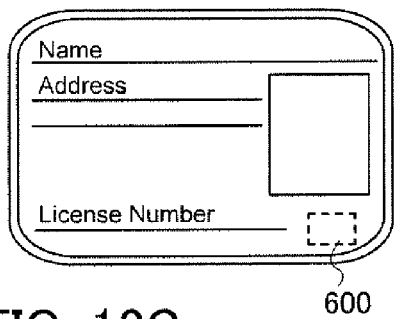
FIGS. 12A to 12G show examples of application of a semiconductor device on which a semiconductor memory device is mounted.
Figure 12B:
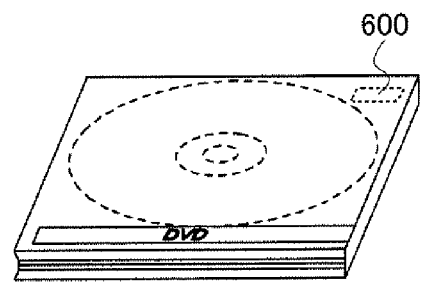
Figure 12C:
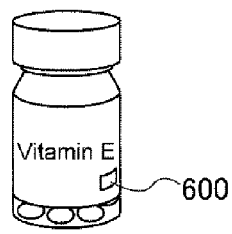
Figure 12D:
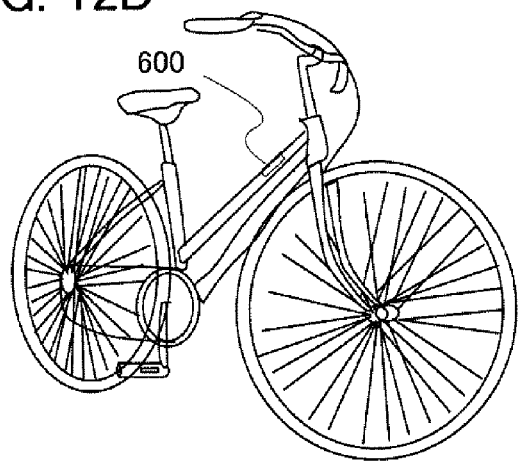
Figure 12E:
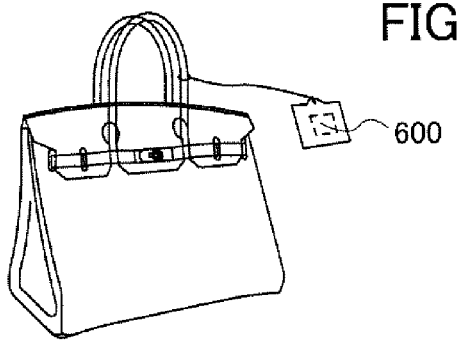
Figure 12F:
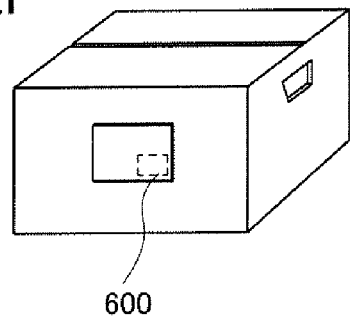
Figure 12G:
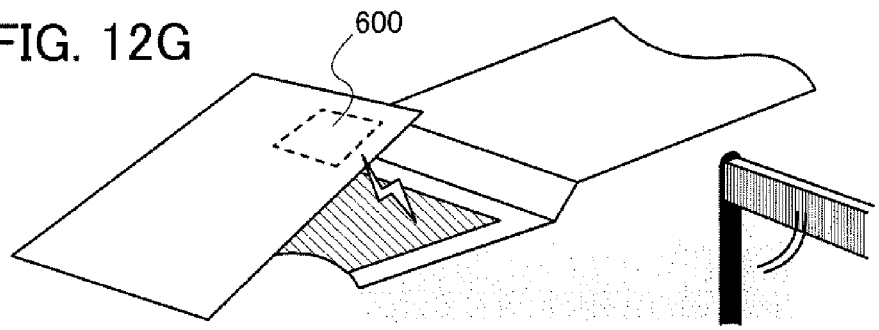
Figure 13A:
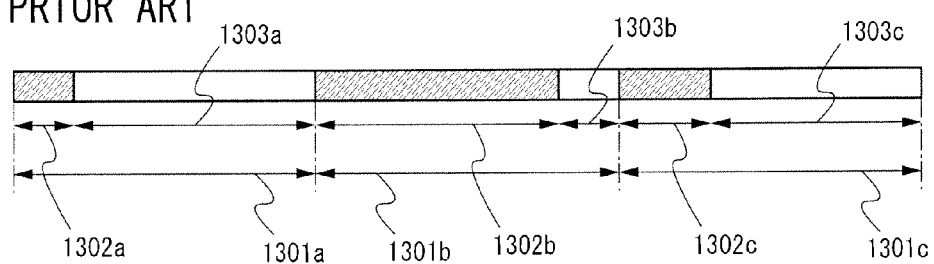
FIGS. 13A to 13C show examples of an operation of memory cells.
Figure 13B:
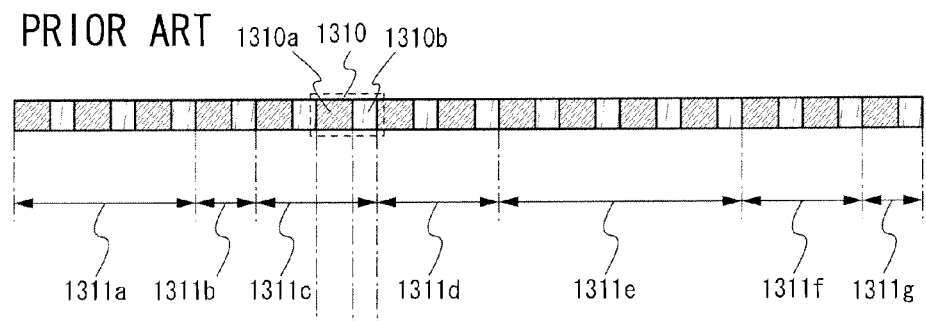
Figure 13C:
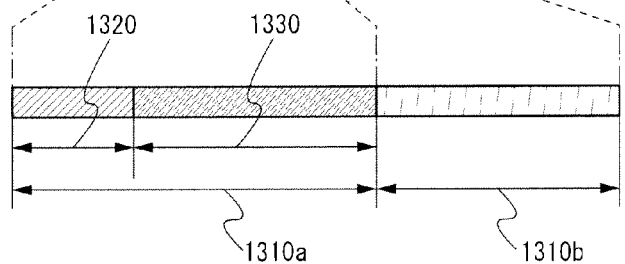

Therefore, as illustrated in FIG. 11C, the transistor in the element portion formed using the separation process is attached in an orientation so that the transistor is not curved in a direction in which current flows from a drain electrode 505 to a source electrode 506. Further, a direction 510 in which current flows and a direction in which a surface of the object to which the element portion is attached forms an arc are perpendicular to each other. With such arrangement, even when the substrate is bent to form an arc, the influence of stress is small, and change in characteristics of the transistor included in the element portion can be suppressed.

Further, when the rate of the area of an active region (a silicon island portion) provided with an active element such as a transistor to the whole area of the substrate is 1% to 50% (preferably 1% to 30%), the element can be prevented from being damaged due to stress.

In a region where an active element is not provided, a base insulating film, an interlayer insulating film, and a wiring are mainly provided. The rate of the area other than the active region provided with a transistor and the like to the whole area of the substrate is preferably 60% or higher. Thus, a semiconductor device which can be easily bent and has a high integration density can be provided.

By manufacturing a semiconductor device including the semiconductor memory device according to one embodiment of the present invention using the above-described method for manufacturing the semiconductor device in Embodiment 6, the semiconductor device can be manufactured even on a curved surface; accordingly, the application of the semiconductor device can be widely varied.

Note that Embodiment 6 can be combined as appropriate with any of other embodiments.

(Embodiment 7)

In Embodiment 7, application examples of a semiconductor device on which the semiconductor memory device according to one embodiment of the present invention is mounted will be described.

Application examples of a semiconductor device on which the semiconductor memory device is mounted will be described with reference to FIGS. 12A to 12G. Here, FIGS. 12A to 12 G are schematic views showing application examples of the semiconductor device.

As shown in FIGS. 12A to 12G, the semiconductor device can be widely used. The semiconductor device can be provided for, for example, bills, coins, securities, bearer bonds, certificates (e.g., driver's licenses or resident cards, see FIG. 12A), containers for wrapping objects (e.g., wrapping paper or bottles, see FIG. 12C), recording media (e.g., DVDs or video tapes, see FIG. 12B), vehicles (e.g., bicycles, see FIG. 12D), personal belongings (e.g., bags or glasses), foods, plants, animals, human bodies, clothes, commodities, or electronic devices (e.g., liquid crystal display devices, EL display devices, television sets, or mobile phones), shipping tags of objects (see FIGS. 12E and 12F), or commuter passes, car-nets, or various tickets (see FIG. 12G).

A semiconductor device 600 is fixed to an object by being mounted on a printed board, attached to a surface, or embedded therein. For example, the semiconductor device is fixed to an object by being embedded in paper in the case of a book or in an organic resin of in the case of a package made of an organic resin. Since the semiconductor device 600 achieves reduction in size, thickness, and weight, the design of the object is not spoiled even after the semiconductor device is fixed to the object. In addition, when the semiconductor device 600 is provided for bills, coins, securities, bearer bonds, certificates, or the like, an authentication function can be provided, and forgery can be prevented by utilizing the authentication function. Further, when the semiconductor device 600 is attached to containers for wrapping objects, recording media, personal belongings, foods, clothes, commodities, electronic devices, or the like, a system such as an inspection system can be efficiently used. Further, since the semiconductor device 600 can be manufactured using elements such as a thin film transistor over a flexible substrate like a resin substrate at low cost, it can be favorably used for disposable items such as carnets or a variety of thickets which are used only once or a small number of times. Furthermore, when the semiconductor device 600 is attached to the vehicles, the vehicles can have higher security against theft or the like.

By thus using the semiconductor device having a semiconductor memory device for purposes given in Embodiment 7, data used for data communication can be kept accurate; therefore, authentication, security, or the like of a product can be improved.

EXAMPLE 1

In Example 1, an example of a manufacturing method of a semiconductor device having an antifuse semiconductor memory device will be described with reference to FIGS. 15A to 15E, FIGS. 16A to 16E, FIGS. 17A to 17E, FIGS. 18A to 18C, and FIGS. 19A to 19D. Here, an example of a manufacturing process of a semiconductor device in which a logic circuit portion 1550, a semiconductor memory circuit portion 1552, and an antenna portion 1554 are provided over the same substrate, is described here.

Circuits including thin film transistors are integrated in the logic circuit portion 1550. The semiconductor memory circuit portion 1552 includes a memory cell including a plurality of thin film transistors and a plurality antifuse memory elements. Note that for convenience, the cross sectional views illustrate two thin film transistors in the logic circuit portion 1550, one thin film transistor and one memory element in the semiconductor memory circuit portion 1552, and one capacitor and one thin film transistor in the antenna portion 1554. Note that each element illustrated in the cross-sectional views in Example 1 may be illustrated with an exaggerated scale in order to describe the cross-sectional structures clearly.

Note that in Example 1, a semiconductor device refers to all devices which can function by utilizing semiconductor characteristics.

First, a metal layer 1502 which serves as a separation layer is formed over a support substrate 1501. A glass substrate is used as the support substrate 1501. A metal material, for example, is used for forming the metal layer 1502. In this Example 1, a tungsten layer, a tungsten nitride layer or a molybdenum layer with a thickness of 30 nm to 200 nm which is obtained by a sputtering method is used as the metal layer 1502.

Then, a surface of the metal layer 1502 is oxidized to form a metal oxide layer. The metal oxide layer may be formed by oxidation of the surface of the metal layer 1502 with pure water or ozone water, or with oxygen plasma. Alternatively, the metal oxide layer may be formed by heating in an atmosphere containing oxygen. Further alternatively, the metal oxide layer may be formed in a later step of forming an insulating layer over the metal layer 1502. For example, when a silicon oxide layer or a silicon oxynitride layer is formed as the insulating layer by a plasma CVD method, the surface of the metal layer 1502 is oxidized, so that the metal oxide layer is formed. Note that the metal oxide layer is not illustrated in the drawings. Further, a base insulating layer such as a silicon oxide layer or a silicon nitride layer may be provided between the metal layer 1502 and the substrate. In Example 1, a silicon oxynitride layer with a thickness of 100 nm and a tungsten layer with a thickness of 30 nm are stacked as the base insulating layer and the metal layer 1502, respectively (see FIG. 15A).

Then, a first insulating layer 1503 is formed over the metal layer 1502. An insulating layer such as a silicon oxide layer, a silicon nitride layer, or a silicon oxynitride layer is formed as the first insulating layer 1503. As an example of the first insulating layer 1503, a two-layer structure can be given which includes a stack of a silicon nitride oxide layer having a thickness of 50 nm to 100 nm which is formed by a plasma CVD method using $SiH_4$, $NH_3$, and $N_2O$ as reactive gases, and a silicon oxynitride layer having a thickness of 100 nm to 150 nm which is formed by a plasma CVD method using $SiH_4$ and $N_2O$ as reactive gases. When the first insulating layer 1503 has a layered structure, at least one layer of the first insulating layer 1503 is preferably a silicon nitride layer or a silicon oxynitride layer having a thickness of 10 nm or less. Alternatively, a three-layer structure may be employed in which a silicon nitride oxide layer, a silicon oxynitride layer, and a silicon nitride layer are stacked in this order. Although the first insulating layer 1503 serves as a base insulating layer, it is not provided if it is not particularly needed. In Example 1, a layered structure of a 50-nm-thick silicon nitride oxide layer and a 100-nm-thick silicon oxynitride layer is used as the first insulating layer 1503 (see FIG. 15B).

Then, a semiconductor layer 1570 is formed over the first insulating layer 1503. The semiconductor layer 1570 is formed as follows: a semiconductor layer having an amorphous structure is formed by a CVD method such as an LPCVD method or a plasma CVD method, or a sputtering method, and then crystallized to obtain a crystalline semiconductor layer, and the crystalline semiconductor layer is selectively etched into a desired shape. As a crystallization method, a laser crystallization method, a thermal crystallization method using RTA or an annealing furnace, a crystallization method using a metal element, such as nickel, which promotes crystallization, or the like may be used. Note that if the semiconductor layer is formed by a plasma CVD method, the first insulating layer 1503 and the semiconductor layer having an amorphous structure can be successively formed without exposure to air. The semiconductor layer is formed to a thickness of 25 nm to 80 nm (preferably 30 nm to 70 nm). Although there is no particular limitation on a material of the semiconductor layer, silicon, silicon germanium, or the like is preferably used.

For crystallization of the semiconductor layer having an amorphous structure, a continuous wave laser can be used. In order to obtain a crystal with a large grain size in crystallization of the semiconductor layer having an amorphous structure, it is preferable to employ second to fourth harmonics of a solid laser capable of continuous wave oscillation. As a typical example, the second harmonic (532 nm) or the third harmonic (355 nm) of an Nd:$YVO_4$ laser (fundamental wave of 1064 nm) may be applied. In the case of using the continuous wave laser, a laser beam emitted from a continuous wave $YVO_4$ laser having an output of 10 W is converted into a harmonics by a non-linear optical element. The harmonics can also be obtained by using a $YVO_4$ crystal and a non-linear optical element put in a resonator. The laser beam is preferably shaped so as to have a rectangular or elliptical laser beam on an irradiation surface by an optical system and then delivered to an object. At this time, an energy density of approximately 0.01 MW/$cm^2$ to 100 MW/$cm^2$ (preferably, 0.1 MW/$cm^2$ to 10 MW/$cm^2$) is needed. Then, the semiconductor layer may be moved at a speed of approximately 10 cm/sec to 2000 cm/sec relatively to the laser beam so as to be irradiated with the laser beam. In Example 1, an amorphous silicon layer with a thickness of 66 nm is stacked over the first insulating layer and is irradiated with laser beam to be crystallized (see FIG. 15C).

Note that if necessary, a small amount of an impurity element (boron or phosphorus) is added to the semiconductor layer in order to control a threshold value of a thin film transistor to be completed later. In Example 1, boron is added by an ion doping method in which diborane ($B_2H_6$) is excited by plasma without mass separation (see FIG. 15D).

Figure 15A:
FIGS. 15A to 15E show one example of a manufacturing process of a semiconductor device.
Figure 15B:
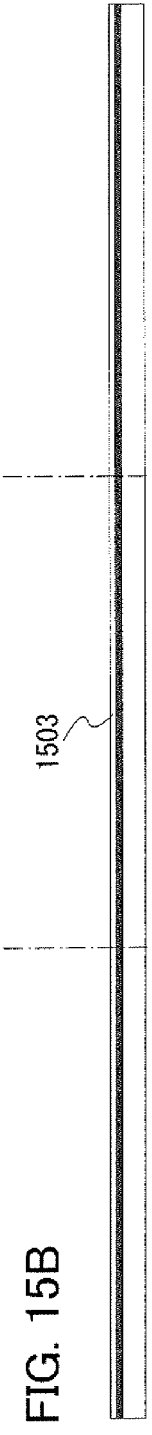
Figure 15C:
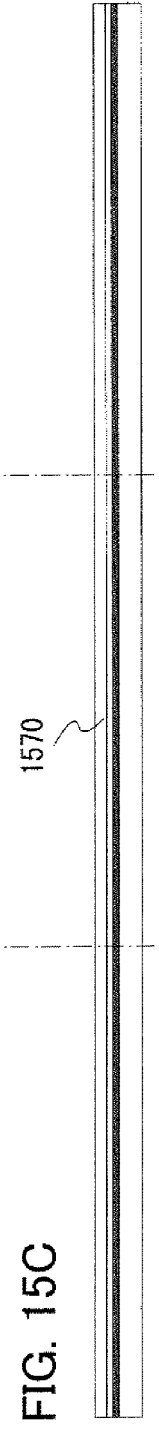
Figure 15D:
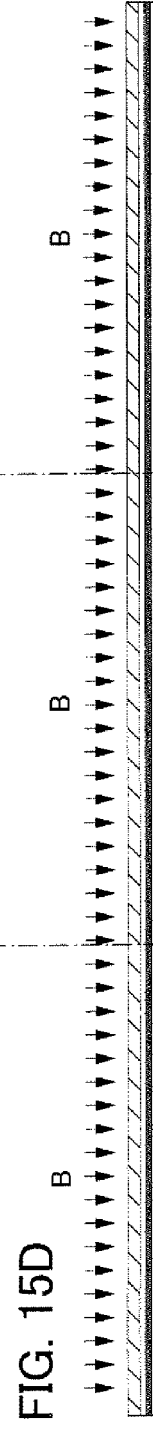
Figure 15E:
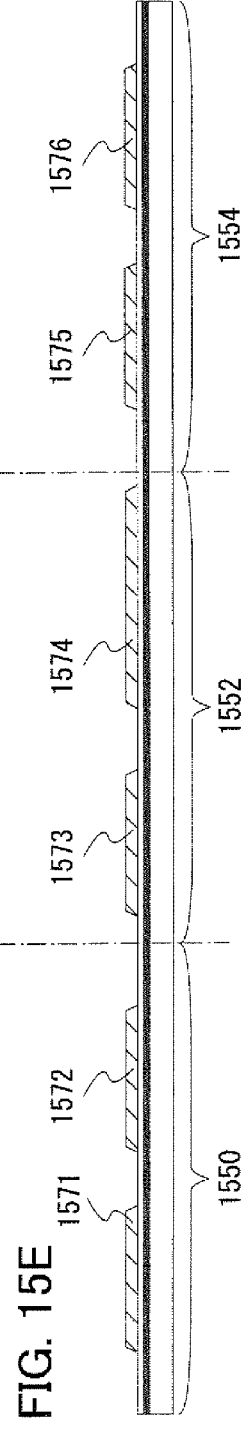

The semiconductor layer 1570 is selectively etched to form semiconductor layers 1571 to 1576 having desired shapes (see FIG. 15E). Further, an impurity element may be additionally added at a low concentration to a semiconductor layer in regions to be included in n-channel transistors in order to form a channel formation region. In Example 1, boron is added while a semiconductor layer in a region to be included a p-channel transistor is covered with a resist mask 1577 (see FIG. 16A).

Then, the surfaces of the semiconductor layers are washed at the same time as removal of an oxide film on the surfaces of the semiconductor layers with an etchant containing hydrofluoric acid. Then, a second insulating layer 1578 which covers the semiconductor layers is formed. The second insulating layer 1578 is formed to a thickness of 1 nm to 200 nm by a CVD method or a sputtering method. Preferably, a single-layer structure or a layered structure including an insulating layer with a thickness of 10 nm to 50 nm containing silicon is formed, and then surface nitridation treatment is performed using plasma excited by a microwave. The second insulating layer 1578 serves as a gate insulating layer (a GI film) of the resulting thin film transistors. In Example 1, a silicon oxynitride layer having a thickness of 10 nm is formed as the second insulating layer 1578 (see FIG. 16B).

In order that the semiconductor layers 1574 and 1575 in a region to be included in a capacitor can serve as conductors, an impurity element (boron or phosphorus) is added to the semiconductor layers at a high concentration. In this case, a region of an assist capacitor in the memory cell is preferably doped with an impurity element imparting p-type conductivity. Note that the region other than the region to be included in the capacitor may be covered with resist masks 1579 to 1581 (see FIG. 16C).

Then, gate electrodes 1504 to 1507, a capacitor electrode 1508, and a first electrode 1509 serving as a lower electrode of a memory element are formed over the second insulating layer 1578. A conductive layer having a thickness of 100 nm to 500 nm which is obtained by a sputtering method is selectively etched and processed into a desired shape, so that the gate electrodes 1504 to 1507, the capacitor electrode 1508 and the first electrode 1509 are obtained.

As a material of the gate electrodes 1504 to 1507, the capacitor electrode 1508, and the first electrode 1509, a substance such as tungsten, titanium, aluminum, nickel, chromium, molybdenum, tantalum, cobalt, zirconium, vanadium, palladium, hafnium, platinum, or iron; an alloy thereof or a compound thereof can be used. The gate electrodes 1504 to 1507, the capacitor electrode 1508, and the first electrode 1509 have a single-layer structure or a layered structure. A material which reacts with silicon to form a silicide is preferably used. Note that a refractory metal is preferably used as the gate electrode of the thin film transistor. Specifically, tungsten or molybdenum can be given. In the case where the gate electrodes 1504 to 1507, the capacitor electrode 1508, and the first electrode 1509 have a layered structure, an upper material layer may be formed using the foregoing material, and a lower material layer on the gate insulating layer side may be a polysilicon layer to which an impurity element such as phosphorus is added. In addition, since the first electrode 1509 is used for an electrode of the antifuse memory element in contact with amorphous silicon, a material which is reacted with silicon is preferably used. In Example 1, a layered structure of a 30-nm-thick tantalum nitride layer and a 370-nm-thick tungsten layer is used (see FIG. 16D).

Then, resist masks 1582 to 1584 are formed so as to cover regions to be included in the p-channel transistor, the capacitor, or the memory cell. An impurity element is introduced into the semiconductor layers in regions to be included in the n-channel transistors, using the gate electrodes 1505, 1506, and 1507 as masks, so that low-concentration impurity regions are formed. As an impurity element, an impurity element imparting n-type conductivity or an impurity element imparting p-type conductivity can be used. As an impurity element imparting n-type conductivity, phosphorus (P), arsenic (As), or the like can be used. In Example 1, phosphorus is added into the semiconductor layers in the regions to be included in the n-channel transistors so as to be contained at a concentrations of $1\times10^{15}/cm^3$ to $1\times10^{19}/cm^3$, so that n-type impurity regions are formed (see FIG. 16E).

Then, the resist masks are removed. Then, resist masks 1585 to 1587 are formed so as to cover the semiconductor layer to be included in the n-channel transistors and the regions to be included in the capacitor, and an impurity element imparting p-type conductivity is added into the semiconductor layer to be included in the p-channel transistor, using the gate electrode 1504 as a mask, so that p-type impurity regions are formed. As the impurity element imparting p-type conductivity, boron (B), aluminum (Al), gallium (Ga), or the like can be used. Here, boron (B) is introduced into the semiconductor layer in the region to be included in the p-channel transistor so as to be contained at a concentration of $1\times10^{19}/cm^3$ to $1\times10^{20}/cm^3$, so that the p-type impurity regions can be formed. As a result, a channel formation region 1516 and a pair of p-type impurity regions 1514 are formed in the semiconductor layer to be included in the p-channel transistor in a self alignment manner. The p-type impurity region 1514 serves as a source region or a drain region. In a similar manner, a p-type impurity region 1515 having different impurity concentration is formed in the semiconductor layer to be included in the capacitor in a self alignment manner. In this step, the impurity is not introduced to p-type impurity regions 1517 because the capacitor electrode 1508 and the first electrode 1509 serve as masks (see FIG. 17A).

Then, sidewall insulating layers are formed on side surfaces of the gate electrodes 1504 to 1507, the capacitor electrode 1508, and the first electrode 1509. A manufacturing method of the sidewall insulating layer will be described. First, a third insulating layer 1588 is formed to have a single-layer structure or a layered structure of a layer containing silicon, oxide of silicon, or nitride of silicon, or a layer containing an organic material such as an organic resin by a plasma CVD method, a sputtering method, or the like so as to cover the second insulating layer 1578, the gate electrodes 1504 to 1507, and the first electrode 1509. In Example 1, a layered structure of a 100-nm-thick silicon oxynitride layer and a 200-nm-thick low temperature oxide (LTO) layer is used (see FIG. 17B).

Then, the third insulating layer 1588 is selectively etched by anisotropic etching in which etching is performed mainly in a perpendicular direction, whereby insulating layers (sidewall insulating layers 1510 and sidewall insulating layers 1511) are formed so as to be in contact with side faces of the gate electrodes 1504 to 1507, the capacitor electrode 1508, and the first electrode 1509. Note that part of the second insulating layer 1578 is removed by being etched at the same time as the formation of the sidewall insulating layers 1510. By removal of the part of the second insulating layer 1578, a gate insulating layer 1512 is formed under each of the gate electrodes 1504 to 1507 and the sidewall insulating layers 1510. In addition, by removal of the part of the second insulating layer 1578, an insulating layer 1513 is formed under each of the capacitor electrode 1508, the first electrode 1509, and the sidewall insulating layers 1511 (see FIG. 17C).

Then, resist masks 1589 to 1591 are formed so as to cover the semiconductor layer in the region to be included in the p-channel transistor and cover the region to be included in the capacitor. Then, an impurity element is introduced into the semiconductor layers in the regions to be included in the n-channel transistors, using the gate electrodes 1505, 1506, and 1507 and the sidewall insulating layers 1510 as masks, so that high-concentration impurity regions are formed. The resist masks 1589 to 1591 are removed after the impurity element is introduced. In Example 1, phosphorus (P) is introduced into the semiconductor layers in the regions to be included in the n-channel transistors so as to be contained at a concentration of $1 \times 10^{19}/cm^3$ to $1 \times 10^{20}/cm^3$, so that n-type high-concentration impurity regions and n-type impurity regions are formed. As a result, in each of semiconductor layers in the region to be included in the n-channel transistors, a channel formation region 1520, a pair of low concentration impurity regions 1519 serving as lightly doped drain (LDD) regions, and a pair of high concentration impurity regions 1518 serving as a source region and a drain region are formed in a self alignment manner. Note that the low concentration impurity regions 1519 serving as LDD regions are formed under the sidewall insulating layer 1510 (see FIG. 17D).

Note that the structure is described in which the LDD regions are formed in the semiconductor layer included in the n-channel thin film transistors and the LDD regions are not formed in the semiconductor layer included in the p-channel thin film transistor, but this is not a limiting example. The LDD regions may be formed in the semiconductor layers included in both the n-channel thin film transistors and the p-channel thin film transistor. In particular, when a gate insulating layer (a GI film) is thin, specifically, when the thickness of the gate insulating layer is 10 nm or less, LDD regions are preferably formed in the p-channel transistor in order to increase the withstand voltage.

Then, after formation of a fourth insulating layer 1522 including hydrogen by a sputtering method, an LPCVD method, a plasma CVD method, or the like, hydrogenation treatment and activation treatment of the impurity element added into the semiconductor layer are performed. Heat treatment (at a temperature of 300° C. to 550° C. for 1 to 12 hours) in a furnace or an RTA method using a lamp light source is performed as the hydrogenation treatment and the activation treatment of the impurity element. For example, a silicon oxynitride layer which is obtained by a plasma CVD method is used for the fourth insulating layer 1522 including hydrogen. Here, the thickness of the fourth insulating layer 1522 including hydrogen is 50 nm to 200 nm. In the case where the semiconductor layer is crystallized using a metal element which promotes crystallization, typically nickel, gettering which reduces nickel in the channel formation region can also be performed at the same time as the activation. Note that the fourth insulating layer 1522 including hydrogen is a first layer of an interlayer insulating layer. In Example 1, a silicon oxynitride layer with a thickness of 50 nm is formed as the fourth insulating layer 1522 and heat treatment at 550° C. for 4 hours is performed on the fourth insulating layer 1522 as the hydrogenation treatment and the activation treatment of the impurity element (see FIG. 7E).

Then, a fifth insulating layer 1523 is formed as a second layer of the interlayer insulating layer by a sputtering method, an LPCVD method, a plasma CVD method, or the like. An insulating layer of a single layer or stacked layers, such as a silicon oxide layer, a silicon nitride layer, or a silicon oxynitride layer is used as the fifth insulating layer 1523. Here, the thickness of the fifth insulating layer 1523 is 300 nm to 800 nm. In Example 1, a layered structure of a 100-nm-thick silicon nitride oxide layer and a 600-nm-thick silicon oxynitride layer is formed and subjected to heat treatment at 410° C. for 1 hour, whereby the fifth insulating layer 1523 is formed (see FIG. 18A).

Then, a resist mask is formed over the fifth insulating layer 1523 and the fourth insulating layer 1522 and the fifth insulating layer 1523 are selectively etched, so that a first opening 1521 which reaches the first electrode 1509 is formed. The resist mask is removed after the etching. The diameter of the first opening 1521 may be approximately 1 µm to 6 µm. In Example 1, the diameter of the first opening 1521 is 2 µm (see FIG. 18B).

Then, as a semiconductor layer used in the memory element, a stacked layer of a silicon oxynitride layer and an amorphous silicon layer is formed by a sputtering method, an LPCVD method, a plasma CVD method, or the like. In Example 1, an amorphous silicon layer having a thickness of 15 nm and a silicon oxynitride layer having a thickness of 6 nm are formed in this order by a plasma CVD method. Then, a resist mask is formed and the amorphous silicon layer and the silicon oxynitride layer are selectively etched, so that a stacked layer 1524 of the amorphous silicon layer and the silicon oxynitride layer which overlaps with the first opening 1521 is formed. The stacked layer 1524 of the amorphous silicon layer and the silicon oxynitride layer serves as a resistant material layer of the memory element. The resist mask is removed after the etching (see FIG. 18C).

Then, a resist mask is formed and the fourth insulating layer 1522 and the fifth insulating layer 1523 are selectively etched, so that contact holes 1592a to 1592j that reach the semiconductor layers, contact holes 1593a to 1593e that reach the gate electrodes, and a second opening 1594 that reaches the first electrode 1509 are formed. The resist mask is removed after the etching (see FIG. 19A).

Then, oxide films formed on exposed surfaces of the semiconductor layers and on an exposed surface of the first electrode 1509 are removed with an etchant containing hydrofluoric acid, and at the same time, the exposed surfaces of the semiconductor layers and the exposed surface of the first electrode 1509 are washed.

Then, a conductive layer is formed by a sputtering method to form an upper electrode of the memory element, and the source and drain electrodes and the like of the thin film transistors. This conductive layer is formed to have a single-layer structure or a layered structure using, as material, a substance such as tungsten, titanium, aluminum, nickel, chromium, molybdenum, tantalum, cobalt, zirconium, vanadium, palladium, hafnium, platinum, or iron, or an alloy or a compound thereof. Note that this conductive layer is also used for the source and drain electrodes of the thin film transistors. Therefore, it is preferable to use a material which has relatively low contact resistance with the semiconductor layers forming the thin film transistors. For example, a three-layer structure of a titanium layer, an aluminum layer containing a minute amount of silicon, and a titanium layer or a three-layer structure of a titanium layer, an aluminum alloy layer containing nickel and carbon, and a titanium layer is employed. In Example 1, a three-layer structure of a 100-nm-thick titanium layer, a 350-nm-thick pure aluminum layer, and a 100- nm-thick titanium layer is employed. Further, in Example 1, an example in which a tungsten layer is used as a material of the lower electrode of the memory element and a titanium layer is used as a material of the upper electrode is shown. However, the materials are not particularly limited as long as they can change the state of the resistance material layer from a high resistance state to a low resistance state and the same material may be used for the upper electrode and the lower electrode of the antifuse memory element. When the lower electrode and the upper electrode of the antifuse memory element are formed using the same material, they are formed to have a single-layer structure or a layered structure of a material which is selected from a substance such as tungsten, titanium, aluminum, nickel, chromium, molybdenum, tantalum, cobalt, zirconium, vanadium, palladium, hafnium, platinum, or iron, an alloy material or a compound material thereof.

Then, a resist mask is formed, and the conductive layer is selectively etched to form a conductive layer 1525, a conductive layer 1526, a conductive layer 1527, a conductive layer 1528, a conductive layer 1531, a conductive layer 1532 each serving as a source electrode or a drain electrode; a wiring 1529 serving as a bit line and a wiring 1530 serving as a word line of a switching transistor; a wiring 1535, a wiring 1536, a wiring 1537 each serving as a gate lead wiring; a second electrode 1540 and a third electrode 1541 of the semiconductor memory circuit portion 1552; a wiring 1533 and a wiring 1534 each serving as an electrode of the capacitor of the antenna portion 1554; and a fourth electrode 1542 of the antenna portion 1554. The second electrode 1540 of the semiconductor memory circuit portion 1552 overlaps with the first opening 1521 and serves as an upper electrode of the memory element. The second electrode 1540 is electrically connected to the semiconductor layer 1574 which serves as one electrode of the assist capacitor. In addition, the third electrode 1541 overlaps with the second opening 1594 to be electrically connected to the first electrode 1509. Note that the fourth electrode 1542 is electrically connected to a thin film transistor of the antenna portion 1554, though the connection is not illustrated here. Then, the resist mask is removed after the etching (see FIG. 19B).

In Example 1, a thin film transistor of the logic circuit portion 1550, a thin film transistor 1558 to serve as a switching transistor of the semiconductor memory circuit portion 1552, an assist capacitor 1559, a memory element 1560, and a thin film transistor of the antenna portion 1554 can be formed over the same substrate. In Example 1, a cross-sectional view illustrates the p-channel transistor and the n-channel transistor in the logic circuit portion 1550, the thin film transistor 1558, the assist capacitor 1559 and the memory element 1560 in the semiconductor memory circuit portion 1552, the capacitor and the n-channel transistor in the antenna portion 1554. Note that an embodiment of the present invention is not limited to this example and the thin film transistor provided in the semiconductor memory circuit portion 1552 may be a p-channel transistor. Further, a p-channel transistor may be provided in the antenna portion 1554. Here, one n-channel thin film transistor is illustrated for convenience.

Then, a sixth insulating layer 1543 is formed to cover the thin film transistors in the logic circuit portion 1550, the thin film transistor and the memory element in the semiconductor memory circuit portion 1552, and the thin film transistor in the antenna portion 1554.

An insulating layer including silicon oxide or an insulating layer formed using an organic resin can be used as the sixth insulating layer 1543. The insulating layer including silicon oxide is preferably used to improve reliability of the semiconductor device. Alternatively, in the case where an antenna to be formed later is formed by a screen printing method, an insulating layer formed using an organic resin, which can be formed by a coating method, is preferably used because the sixth insulating layer 1543 preferably has a planarized surface. The material for forming the sixth insulating layer 1543 may be selected by a practitioner as appropriate.

Further, the antenna to be formed later may reach a region which overlaps with the logic circuit portion 1550 and the semiconductor memory circuit portion 1552. In this case, the sixth insulating layer 1543 also serves as an interlayer insulating layer for insulation of the antenna. In the case where the antenna has a circular shape (for example, a loop antenna) or a spiral shape, one of two ends of the antenna is led by an underlying wiring; thus, it is preferable to provide the sixth insulating layer 1543. However, in the ease where a microwave method is employed and the antenna has a linear shape (for example, a dipole antenna), a flat shape (for example, a patch antenna), or the like, the antenna to be formed later can be located so as not to overlap with the logic circuit portion and the semiconductor memory circuit portion 1552; thus, the sixth insulating layer 1543 is not necessarily provided.

Then, a resist mask is formed, and the sixth insulating layer 1543 is selectively etched, so that a third opening 1595 that reaches the third electrode 1541 and a fourth opening 1596 that reaches the fourth electrode 1542 are formed. The resist mask is removed after the etching (see FIG. 19C).

Then, a metal layer is formed over the sixth insulating layer 1543. As the metal layer, a single layer or a stacked layer of a material selected from Ti, Ni and/or Au can be used. Then, a resist mask is formed, and the metal layer is selectively etched to form a lead wiring 1544 for the first electrode 1509 and a base layer 1545 for the antenna. Note that the lead wiring 1544 and the base layer 1545 here can be selectively formed by a sputtering method using a metal mask without using the resist mask. By providing the base layer 1545 for the antenna, a large contact area with the antenna can be secured. The lead wiring 1544 is not necessarily formed depending on a layout of a circuit design. The lead wiring 1544 is connected, as a cathode, to a ground power source.

Then, an antenna 1546 is formed over the base layer 1545 for the antenna. The antenna 1546 can be formed by such a method in which a metal layer of Al, Ag, or the like is formed by a sputtering method and then is selectively etched into a desired shape. Alternatively, the antenna 1546 can be formed by a screen printing method. A screen printing method refers to a method in which an ink or a paste is provided on a screen plate which has a predetermined pattern formed from a photosensitive resin on a base made of a metal mesh or a high molecular compound fiber mesh, and the ink or the paste is transferred to a target which is on the opposite side of the screen plate, with a rubber, plastic, or metal blade which is called a squeegee. A screen printing method has a merit that pattern can be formed in a relatively large area at low cost (see FIG. 19D).

In Example 1, the thin film transistor in the logic circuit portion 1550, the thin film transistor and the memory element in the semiconductor memory circuit portion 1552, and the thin film transistor and the antenna in the antenna portion 1554 can be formed over the same substrate.

Then, the metal layer 1502 and the support substrate 1501 are removed by separation. Separation can be generated in the metal oxide layer, at an interface between the first insulating layer 1503 and the metal oxide layer, or at an interface between the metal oxide layer and the metal layer 1502. The first insulating layer 1503 and components thereover which serve as the semiconductor device can be separated from the support substrate 1501 with relatively small force. When the metal layer 1502 and the support substrate 1501 are removed, a fixing substrate may be attached to the side where the antenna is provided.

Then, one sheet in which a plurality of semiconductor devices are formed is divided to provide individual semiconductor devices by a cutter, a dicer, or the like. If a method in which semiconductor devices are individually picked up to be separated in the separation step, this dividing step is not needed.

Then, the semiconductor device is fixed to a sheet base. For the sheet base, plastic, paper, a prepreg, a ceramic sheet, or the like can be used. The semiconductor device may be fixed so as to be interposed between two sheet bases, or may be fixed to one sheet base with an adhesive layer. For the adhesive layer, various curable adhesives such as a reactive curable adhesive, a thermosetting adhesive, or a photo curable adhesive such as an ultraviolet cure adhesive, or an anaerobic adhesive can be used. The semiconductor device may be provided during the formation of paper, so that the semiconductor device can be embedded in a piece of paper.

Through the above process, a semiconductor memory device and a semiconductor device can be formed concurrently. Thus, simplification of the manufacturing process and reduction in size of the semiconductor device having the semiconductor memory device can be achieved. In addition, the logic circuit portion 1550, the semiconductor memory circuit portion 1552, and the antenna portion 1554 are formed over the same substrate, whereby malfunction in writing or reading data can be reduced.

EXAMPLE 2

Figure 14:
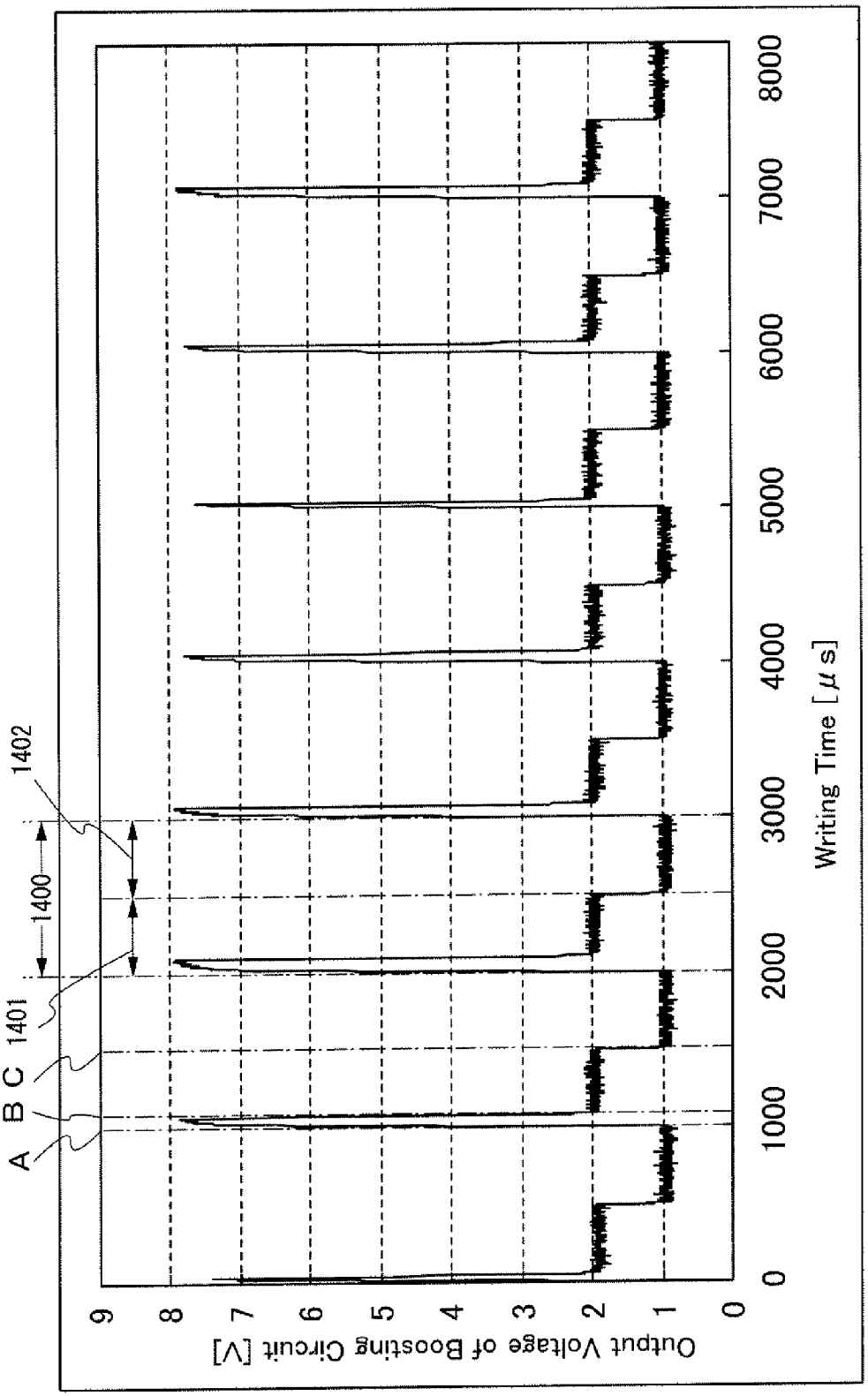
FIG. 14 is a graph showing an output voltage of a boosting circuit in a writing operation on memory elements.

In Example 2, a change in output voltage of a boosting circuit during a writing operation on a memory element is described in FIG. 14.

FIG. 14 is a graph of a plot of an output voltage of the boosting circuit in writing into the antifuse memory which is manufactured in Example 1. A writing time for one memory cell is denoted by 1400. In the period 1400, a period of time for applying a writing voltage to one memory cell is 500 μs and is shown as a period 1401. After the writing operation, a standby period for 500 μs as shown as a period 1402 is provided, then, a writing operation starts for the next element. Such an operation is repeated. As shown in FIG. 14, after the writing operation starts (Point A), a voltage rises. When the voltage reaches approximately 8V (Point B), the voltage rapidly falls. The voltage remains at approximately 2V until the writing operation finishes (Point C). The cause of such a change will be given. During the period from Point A to Point B, the memory element is not shorted yet; thus, the output voltage rises by an operation of the boosting circuit. At Point B, the memory element is shorted and the load on the output of the boosting circuit becomes smaller, whereby the output voltage rapidly falls from Point B. Then, during the period from Point B to Point C, which is a period before the writing operation finishes, the output in accordance with the load after shortening of the memory element is output from the boosting circuit.

By detecting the change (particularly, the voltage decrease at Point B), whether the data is written to the memory element or not can be determined without a reading operation. Then, with this detected point as a trigger, the boosting circuit can be stopped as the end of the writing is detected or writing into the next memory element can be started immediately.

EXAMPLE 3

In this Example 3, a period of time estimated as necessary for writing into a memory element will be described with reference to FIG. 4 and FIG. 5.

Figure 4:
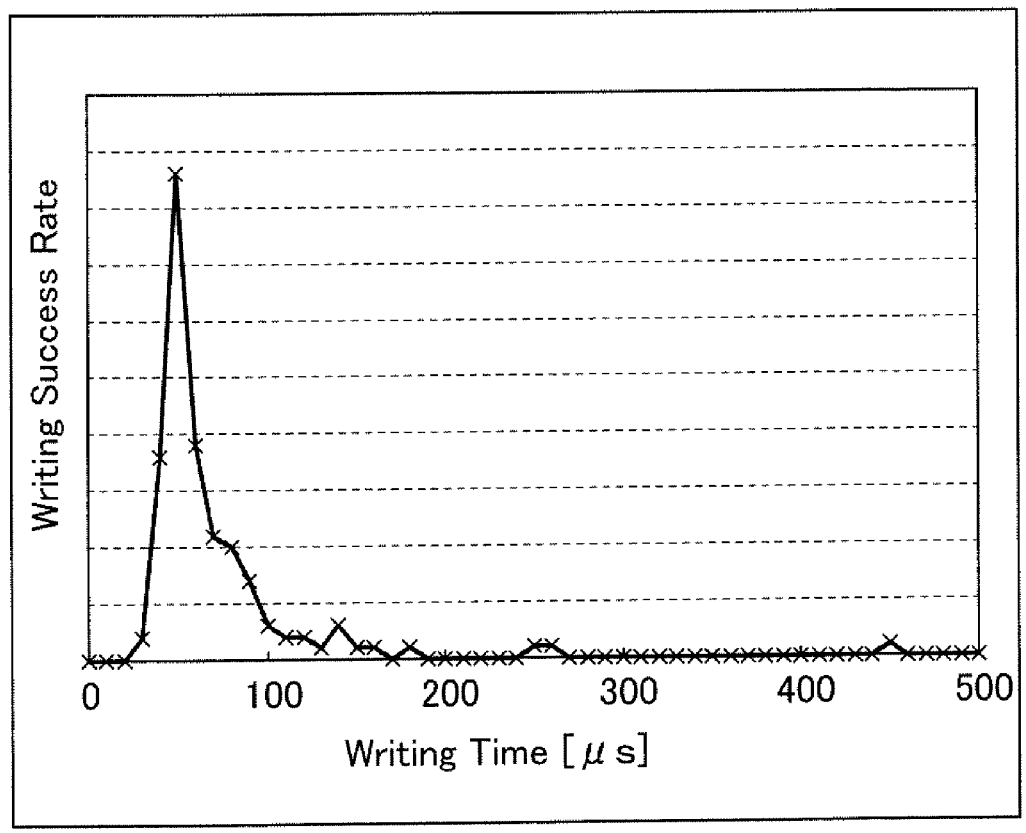
FIG. 4 is a graph showing a writing success rate versus a writing time in an OTP memory.

FIG. 4 is a graph of a plot of a writing success rate (frequency of writing) versus a writing time in an OTP memory in a given condition. As shown in FIG. 4, most of the memory elements need a short time within 50 μs from the beginning of writing. On the other hand, there are some memory elements which need a longer writing time. In Example 3, there is a memory element which needs a writing time longer than 400 μs.

The cause of such a variation will be described. When the unit writing time τ is hypothetically determined and the average writing time is represented as μ, the memory element is shorted with a probability of τ/μ every time the writing time τ passes. Therefore, when the cumulative distribution P of the writing success rate versus the writing time T is plotted, P is expressed by the exponential distribution:

$$P=1-[1/\{\exp(T/\mu)\}]$$

In an actual measurement, since it takes time from when a writing operation starts until when a writing voltage is increased sufficiently high to perform the writing operation, correction therefor is needed.

Figure 5:
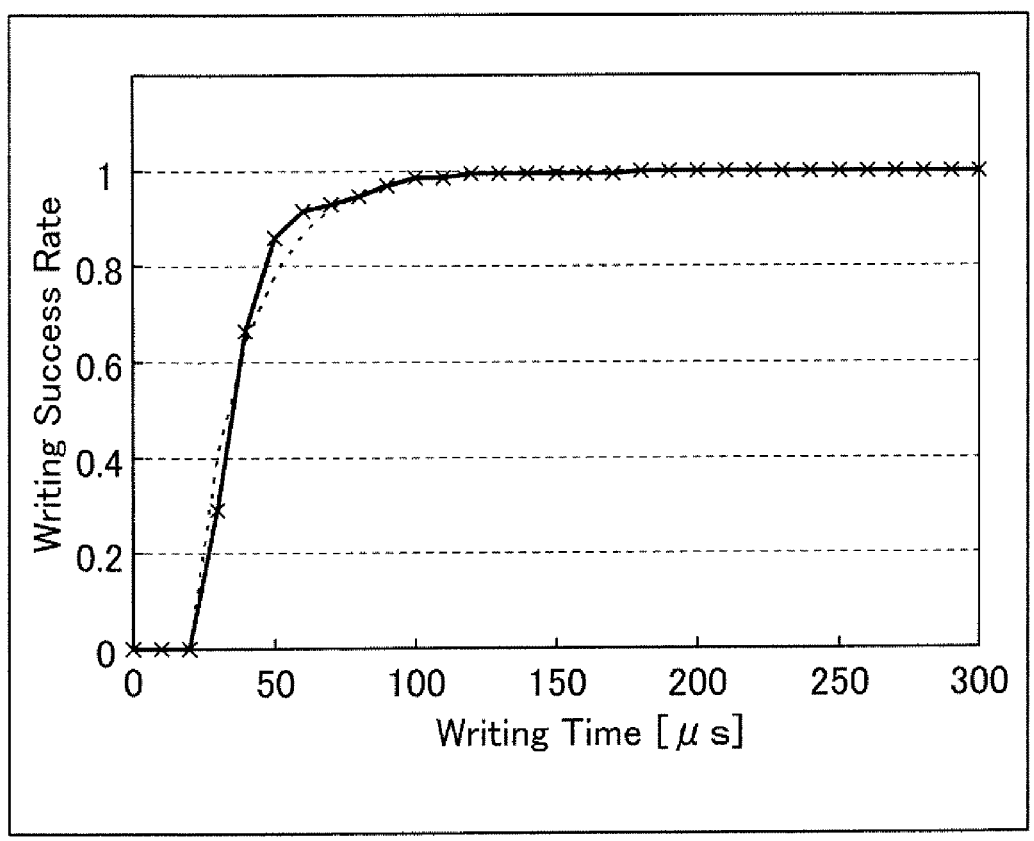
FIG. 5 is a graph showing a comparison between an experimental cumulative frequency distribution and a theoretical cumulative frequency distribution of a writing success rate versus a writing time in an OTP memory.

FIG. 5 is a graph of a writing success rate versus a writing time in the OTP memory. The graph of FIG. 5 is for a comparison between the theoretical cumulative frequency distribution (plotted in a dotted line) based on the exponential distribution and the experimental cumulative frequency distribution (plotted in a solid line) in which correction is performed provided that time needed for boosting a voltage is 20 μs, based on the writing success rate versus the writing time shown in FIG. 4. As is shown in FIG. 5, the result in which the time needed for boosting a voltage is corrected can be closely approximated by the theoretical result based on the exponential distribution.

Thus, in the case where the writing time can be expressed by the exponential distribution, there are a small number of memory elements which need a long writing time and a plurality of memory elements which need a short writing time. Specifically, one memory element needs 4.6 times the average writing time μ with a probability of 1%, 9.2 times the average writing time μ with a probability of 0.01%, and 13.8 times the average writing time μ with a probability of 1 ppm.

EXAMPLE 4

An example according to above Embodiments and Examples is compared with a conventional example. For the comparison, a period of time for writing into one memory element are calculated in the following cases: the case where above Embodiments and Examples are employed; and the cases where the methods given in SUMMARY OF THE INVENTION are employed, that is, the case where the same period of time is employed for writing into every memory cell and the case where a writing time is divided by 50 μs and whether data is written or not is determined in the following reading time of 5 μs.

In the case where the same period of time is employed for writing into every memory cell, the average writing time is set at 20 μs, the time needed for boosting a voltage is set at 20 μs and an allowable error rate is set at 1 ppm. In this case, the writing time corresponds to the allowable error rate. Therefore, the required writing time is as follows:

μs×14.6(the time for writing with an error rate of 1 ppm)+20 μs(the time needed for boosting a voltage)=312 μs In the case where writing is performed in unit time, the writing success rate is calculated every 50 μs (in which an effective writing time is 30 μs). Since the probability of success in writing after one unit time is 78.5%, the probability of success in writing after first unit time (50 μs+a reading time of 5 μs=55 μs) is 78.5%, and the probability of success in writing after second unit time (110 μs) is 16.9%. After repetition of 11 unit times (550 μs), the probability of error in writing becomes 1 ppm. The average writing time is obtained by summing the results of multiplications of the frequency (the probability of success in writing) of each unit by the writing time. The average writing time obtained is 70 μs.

In the example according to above Embodiments and Examples, a writing operation finishes when the writing finishes; therefore, the sum of the average writing time and the time needed for boosting a voltage is the time needed for one memory element. The time obtained is 40 μs. Thus, in the example according to above Embodiments and Examples, the writing time can be reduced by 87% compared with the case where the same period of time is employed for writing into every memory cell and by 43% compared with the case where writing is performed in unit time.

EXAMPLE 5

In Example 5, an effect of reducing current consumption in writing in an example in which an operation according to above Embodiments and Examples is employed is verified by comparison with a conventional example, using circuit simulation.

Figure 20A:
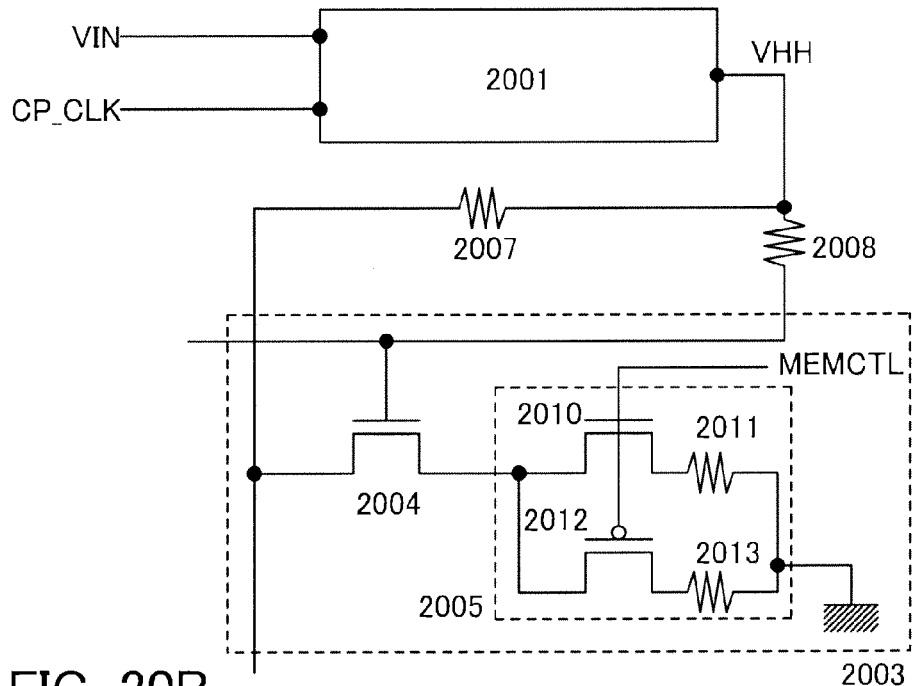
FIGS. 20A and 20B show circuit simulation models.
Figure 20B:
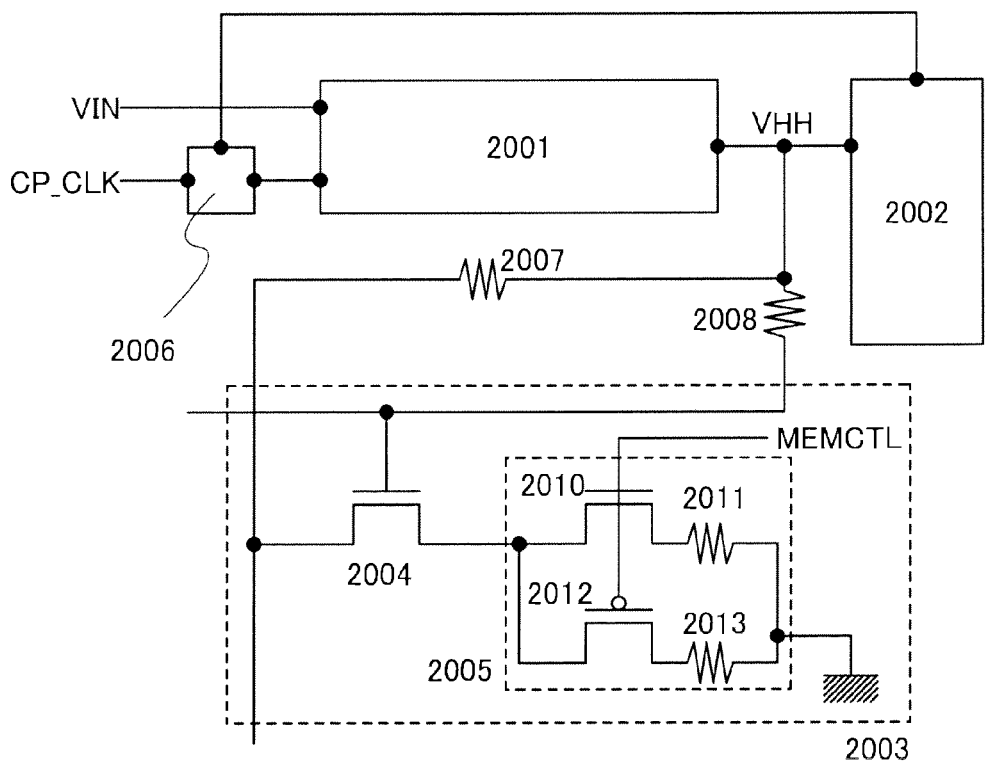

FIGS. 20A and 20B are circuit diagrams of models of circuit simulation for comparing a conventional example and an example in Example 5.

FIG. 20A shows a conventional example which has a boosting circuit 2001, a memory cell 2003, and resistors 2007 and 2008 of 10 kΩ which are regarded as load of a decoder. The circuit shown in FIG. 3 was used as the boosting circuit 2001. The memory cell 2003 includes a transistor 2004 and a memory element 2005. The memory element 2005 includes a transistor 2010 and a resistor 2011, and a transistor 2012 and a resistor 2013 for representing shortening and a decrease in resistance in writing. The resistor 2011 was set at a relatively low resistance (1 kΩ) as a resistance of the memory element after shortening, while the resistor 2013 was set at a relatively high resistance (100 MΩ) as a resistance of the memory element before shortening. Either the transistor 2010 or the transistor 2012 is turned on by a signal (MEMCTL). In this simulation, assuming that writing can finish in 5 μs after the start of writing, the signal (MEMCTL) is set to be 0 V for 5 μs from the start of writing and after that the signal (MEMCTL) is set to be 10 V.

FIG. 20B is an example according to one embodiment of the present invention. FIG. 20B includes a monitor circuit 2002 and a control circuit 2006 in addition to the components in the conventional example. The circuit shown in FIG. 2A was used as the monitor circuit 2002. A NAND gate is used for the control circuit 2006.

Simulation was performed as follows: a writing operation was performed under the condition where the input voltage (Vin) was 3V and the frequency of a clock signal (CP_CLK) was 3.39 MHz; and it was assumed that the memory element was shorted after 5 μs. The voltage and the current in the simulation were measured to be plotted.

Figure 21A:
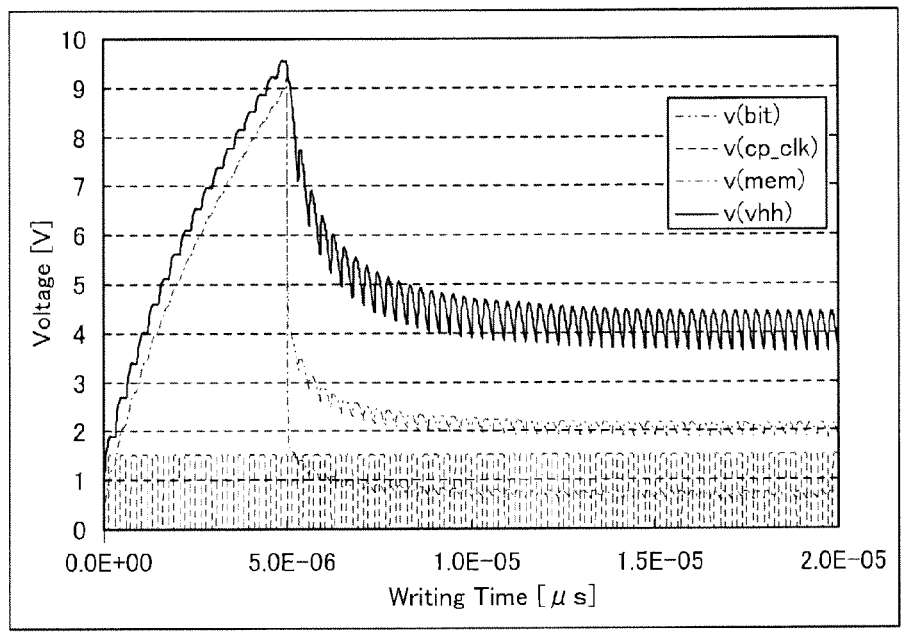
FIGS. 21A and 21B show voltage and current in a circuit simulation model of a conventional example.
Figure 21B:
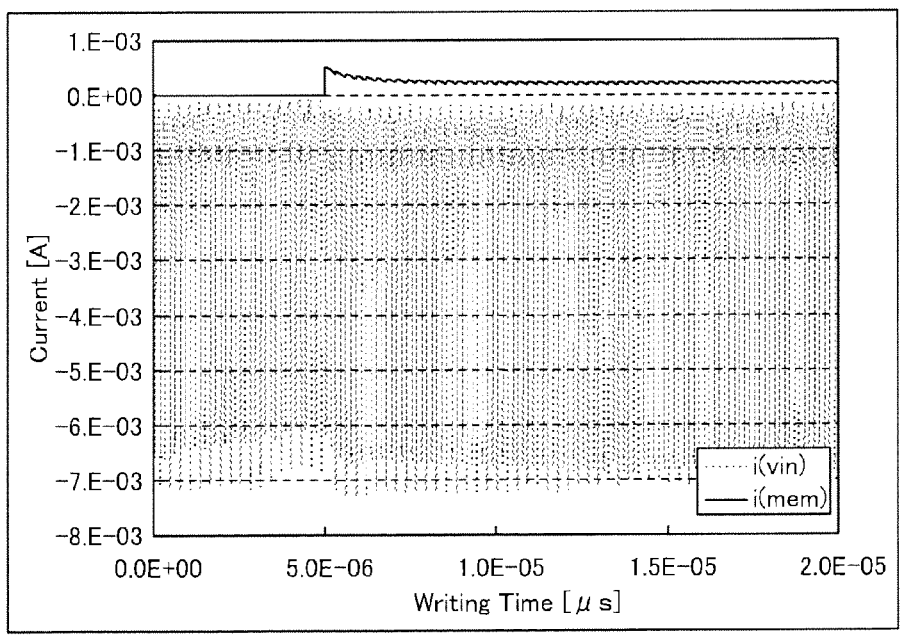
Figure 22A:
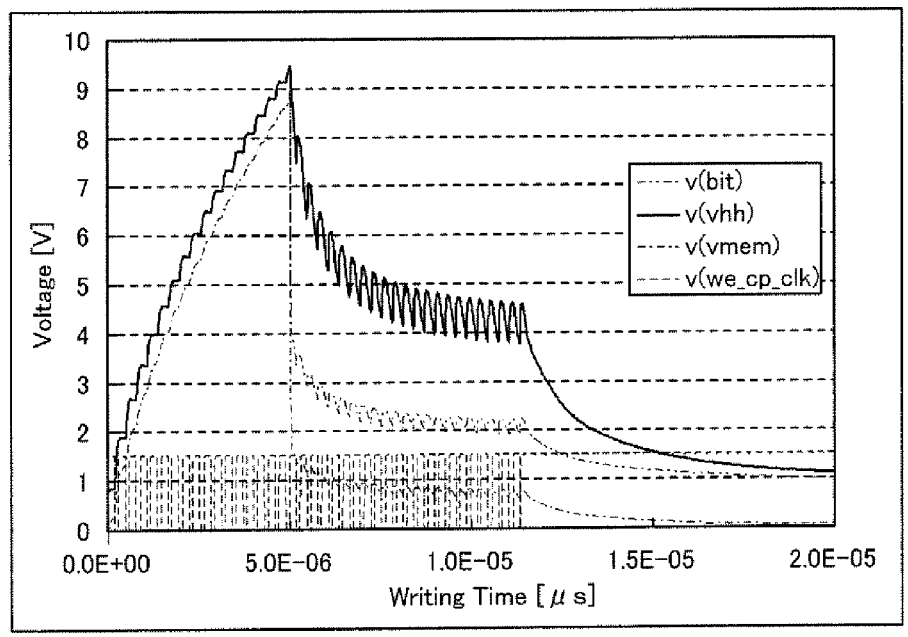
FIGS. 22A and 22B show voltage and current in a circuit simulation model of an Example.
Figure 22B:
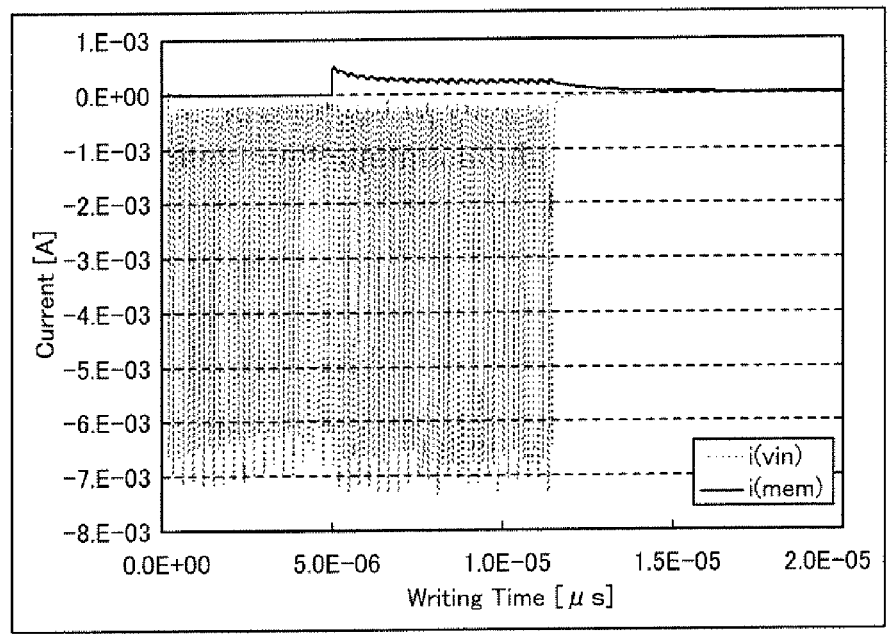

FIGS. 21A and 21B show the result of circuit simulation of the model with a conventional structure, while FIGS. 22A and 22B show the result of circuit simulation of the model in Example 5, which is an example in which an operation according to above Embodiments and Examples is employed. As for voltages, the following voltages were measured: an output voltage (VHH) of the boosting circuit, a clock signal (CP_CLK) of the boosting circuit (or an output (WE_CP_CLK) of the control circuit 2006 in the example in which an operation according to above Embodiments and Examples is employed), a voltage (MEM) applied to a memory element, and a voltage (BIT) applied to a wiring connecting the resistor 2007 and the transistor 2004. As for current, current of an input voltage (Vin) and current flowing through the memory element were measured. In addition, FIGS. 21A and 21B and FIGS. 22A and 22B show averages of current in a period time from the start of writing to shortening of the memory element (0 μs to 5 μs), a voltage just before the memory element is shorted (5 μs), averages of voltage and current in a period time from when the memory element is shorted until an output voltage (VHH) of the boosting circuit decreases (5 μs to 15 μs), averages of voltage and current in a period time after the memory element is shorted (15 μs to 75 μs), and averages of current in a period time from the start of writing to the end (0 μs to 75 μs).

As shown in FIGS. 21A and 21B, the boosting circuit continues an operation after the memory element is shorted in the conventional structure. Therefore, current of the boosting circuit is as much as a few milliamperes and thus approximately 200 μA of current flows through the memory element. On the other hand, as shown in FIGS. 22A and 22B, when the output voltage (VHH) of the boosting circuit decreases after the memory element is shorted, the clock input to the boosting circuit stops in the example in which an operation according to above Embodiments and Examples is employed. Therefore, both of the current of the boosting circuit and the current flowing through the element after the shortening of the memory element is a few microamperes.

FIGS. 23A and 23B are tables for a comparison of voltage and current between circuit simulation models of a conventional structure and Example 5. An average and a RMS of each writing time are shown on the left-hand side and on the right-hand side respectively in each cell in the rows of I(MEMS) and I(VIN) in FIGS. 23A and 23B. As shown in FIGS. 23A and 23B, in the case where the writing time is 75 μs, the average current in the example in which an operation according to above Embodiments and Examples is employed is approximately one-seventh of that of the conventional structure.

The embodiments and examples have been described so far, but the present invention is not limited to the above description. It will be readily appreciated by those skilled in the art that modes and details can be modified in various ways without departing from the spirit and the scope of the present invention. Therefore, the present invention is not construed as being limited to the description of the embodiments and example given above.

This application is based on Japanese Patent Application serial no. 2009-100811 filed with Japan Patent Office on Apr. 17, 2009, the entire contents of which are hereby incorporated by reference.

What is claimed is:

1. A semiconductor memory device comprising:
a memory element comprising a first electrode, a second electrode, and a semiconductor layer between the first electrode and the second electrode;
a boosting circuit configured to generate a writing voltage, an output terminal of the boosting circuit being electrically connected to the memory element; and
a monitor circuit electrically connected to the output terminal of the boosting circuit,
wherein the monitor circuit comprises a comparator, a first resistor, a second resistor, a third resistor, a fourth resistor and a NAND gate,
wherein a first terminal of the first resistor is electrically connected to the output terminal of the boosting circuit,
wherein a second terminal of the first resistor is electrically connected to a first terminal of the second resistor and a first input terminal of the comparator,
wherein a first voltage is applied to a first terminal of the third resistor.
wherein a second terminal of the third resistor is electrically connected to a first terminal of the fourth resistor and a second input terminal of the comparator,
wherein a second voltage is applied to a second terminal of the second resistor and a second terminal of the fourth resistor,
wherein an output of the comparator is input to the NAND gate,
wherein the monitor circuit is configured to detect a voltage change in the output terminal of the boosting circuit in a writing operation on the memory element and output a signal to stop the writing operation on the memory element from the NAND gate, and
wherein the boosting circuit is configured to stop a boosting operation by stopping a supply of a clock signal to the boosting circuit in accordance with the signal.

2. The semiconductor memory device according to claim 1,
wherein the memory element is configured to store data in such a way that the writing voltage is applied between the first electrode and the second electrode to change a value of resistance between the first electrode and the second electrode.

3. An electronic device comprising the semiconductor memory device according to claim 1.

4. A semiconductor memory device comprising:
a memory element comprising a first electrode, a second electrode, and a semiconductor layer between the first electrode and the second electrode;
a boosting circuit configured to generate a writing voltage, an output terminal of the boosting circuit being electrically connected to the memory element;
a control circuit configured to input a signal to the boosting circuit; and
a monitor circuit electrically connected to the output terminal of the boosting circuit, the monitor circuit being configured to control the control circuit,
wherein the monitor circuit comprises a comparator, a first resistor, a second resistor, a third resistor, a fourth resistor and a NAND gate,
wherein a first terminal of the first resistor is electrically connected to the output terminal of the boosting circuit,
wherein a second terminal of the first resistor is electrically connected to a first terminal of the second resistor and a first input terminal of the comparator,
wherein a first voltage is applied to a first terminal of the third resistor,
wherein a second terminal of the third resistor is electrically connected to a first terminal of the fourth resistor and a second input terminal of the comparator,
wherein a second voltage is applied to a second terminal of the second resistor and a second terminal of the fourth resistor,
wherein an output of the comparator is input to the NAND gate, and
wherein the boosting circuit is configured to stop a boosting operation by stopping a supply of a clock signal to the boosting circuit in accordance with the signal.

5. The semiconductor memory device according to claim 4,
wherein the signal is a signal for stopping the boosting operation of the boosting circuit.

6. The semiconductor memory device according to claim 4,
wherein the memory element stores data in such a way that the writing voltage is applied between the first electrode and the second electrode to change a value of resistance between the first electrode and the second electrode.

7. An electronic device comprising the semiconductor memory device according to claim 4.

8. A semiconductor memory device comprising:
a memory element;
a boosting circuit; and
a monitor circuit comprising a comparator, a first resistor, a second resistor, a third resistor. a fourth resistor and a NAND gate,
wherein a first terminal of the first resistor is electrically connected to an output terminal of the boosting circuit,
wherein a second terminal of the first resistor is electrically connected to a first terminal of the second resistor and a first input terminal of the comparator,
wherein a first voltage is applied to a first terminal of the third resistor,
wherein a second terminal of the third resistor is electrically connected to a first terminal of the fourth resistor and a second input terminal of the comparator,
wherein a second voltage is applied to a second terminal of the second resistor and a second terminal of the fourth resistor,
wherein an output of the comparator is input to the NAND gate,
wherein the output terminal of the boosting circuit is electrically connected to the memory element,
wherein the monitor circuit is electrically connected to the output terminal of the boosting circuit,
wherein an input terminal of the comparator is electrically connected to the output terminal of the boosting circuit, and
wherein the boosting circuit is configured to stop a boosting operation by stopping a supply of a clock signal to the boosting circuit in accordance with an output from the NAND gate.

9. The semiconductor memory device according to claim 8,
wherein the memory element comprises a first electrode, a second electrode, and a semiconductor layer between the first electrode and the second electrode, and
wherein the memory element stores data in such a way that a writing voltage is applied between the first electrode and the second electrode to change a value of resistance between the first electrode and the second electrode.

10. An electronic device comprising the semiconductor memory device according to claim 8.

* * * * *